United States Patent
Lee et al.

(10) Patent No.: US 7,338,737 B2
(45) Date of Patent: Mar. 4, 2008

(54) PHOTOSENSITIVE RESIN COMPOSITION, THIN FILM PANEL MADE WITH PHOTOSENSITIVE RESIN COMPOSITION, AND METHOD FOR MANUFACTURING THIN FILM PANEL

(75) Inventors: Hi-Kuk Lee, Gyeonggi-do (KR); Yuko Yako, Osaka (JP); Dong-Ki Lee, Seoul (KR); Kyu-Young Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 140 days.

(21) Appl. No.: 11/302,727

(22) Filed: Dec. 13, 2005

(65) Prior Publication Data

US 2006/0131267 A1    Jun. 22, 2006

(30) Foreign Application Priority Data

Dec. 16, 2004  (KR) ................. 10-2004-0106956

(51) Int. Cl.
*G03F 7/023*  (2006.01)
*G03F 7/30*  (2006.01)

(52) U.S. Cl. .............. 430/18; 430/191; 430/192; 430/193; 430/311; 430/313; 430/326; 430/330

(58) Field of Classification Search ............. 430/18, 430/191, 192, 193, 311, 313, 326, 330
See application file for complete search history.

(56) References Cited

U.S. PATENT DOCUMENTS

| 6,379,860 B1 | 4/2002 | Fujimori et al. ......... 430/270.1 |
| 6,787,286 B2 * | 9/2004 | Szmanda et al. ......... 430/270.1 |
| 6,797,453 B2 * | 9/2004 | Shiraki et al. ........... 430/270.1 |
| 6,905,809 B2 * | 6/2005 | Eilbeck ..................... 430/190 |

FOREIGN PATENT DOCUMENTS

| JP | 2000-080124 | 3/2000 |
| JP | 2002-055450 | 2/2002 |
| JP | 2004-126509 | 4/2004 |
| KR | 1020010045129 | 6/2001 |
| KR | 1020030033786 | 5/2003 |
| KR | 1020030051129 | 6/2003 |

* cited by examiner

*Primary Examiner*—John S. Chu
(74) *Attorney, Agent, or Firm*—MacPherson Kwok Chen & Heid LLP

(57) ABSTRACT

A photosensitive resin composition includes an alkali-soluble resin, a quinone diazide, a surfactant, and a solvent. The solvent includes a diethylene glycol dialkyl ether that includes an alkyl group including one to five carbon atoms, an ethyl 3-ethoxy propionate, an alkyl acetate that includes an alkyl group including three to eight carbon atoms, and an alkyl lactate that includes an alkyl group including one to six carbon atoms. The composition may be used to make high-quality display panels with uniformly-coated insulating layers.

24 Claims, 18 Drawing Sheets

PHOTOSENSITIVE RESIN COMPOSITION, THIN FILM PANEL MADE WITH PHOTOSENSITIVE RESIN COMPOSITION, AND METHOD FOR MANUFACTURING THIN FILM PANEL

CROSS-REFERENCE TO RELATED APPLICATION

This application claims priority from Korean Patent Application No. 10-2004-0106956 filed on Dec. 16, 2004, the content of which is incorporated by reference herein in its entirety.

BACKGROUND OF THE INVENTION (a) Field of the Invention

The present invention relates generally to a photosensitive resin composition, a thin film panel including a layer made with the photosensitive resin composition, and method of manufacturing the thin film panel. In particular, the invention relates to a photosensitive resin composition for insulation of a display panel.

(b) Description of Related Art

An active type display device such as an active matrix (AM) liquid crystal display (LCD) and an active matrix organic light emitting diode (OLED) display includes a plurality of pixels arranged in a matrix. The pixels in the matrix include switching elements, and the pixel boundaries are usually formed by a plurality of signal lines such as gate lines and data lines for transmitting signals to the switching elements. The switching elements of the pixels selectively transmit data signals from the data lines to the pixels in response to gate signals from the gate lines for displaying images. The pixels of the LCD adjust the transmittance of incident light according to the data signals, while those of the OLED display adjust the luminance of light emission according to the data signals.

The LCD and the OLED displays include a panel provided with the TFTs, the field-generating electrodes, the signal lines, etc. The panel has a layered structure that includes several conductive layers and insulating layers. The gate lines, the data lines, and the field-generating electrodes are formed of different conductive layers and are separated by insulating layers.

The insulating layers are made of inorganic or organic insulators. Organic insulators have a transmittance higher than the inorganic insulators, and therefore often provide increased luminance (and an increased reference viewing angle for an LCD). Several of these organic insulators have a photosensitivity level that allows them to be patterned only by lithography without etching, thereby simplifying the display manufacturing process.

However, conventional photosensitive organic insulating layers often have various spots or stains. In particular, as the display devices increase in size, stains related to the coating of the organic insulating layers are frequently generated. The stains may be horizontal stains along a direction of a slit-type nozzle of a coating device, vertical stains along a lengthwise direction of the slit-type nozzle, or irregular spots over an entire surface of a substrate. In addition, portions of the organic layer near the edges of a substrate are sometimes thicker than other portions of the organic layer. These portions with extra thickness may not completely dissolve during the development such that they are unnecessarily remained to form stains, degrading the image quality of the display device.

A method and device for forming organic insulating layers with fewer stains is desired.

SUMMARY OF THE INVENTION

In one aspect, the invention is a photosensitive resin composition includes an alkali-soluble resin, a quinone diazide, a surfactant, and a solvent. The solvent includes a diethylene glycol dialkyl ether that includes an alkyl group having one to five carbon atoms, an ethyl 3-ethoxy propionate, an alkyl acetate that includes an alkyl group having three to eight carbon atoms, and an alkyl lactate that includes an alkyl group having one to six carbon atoms.

The weight percentage of the diethylene glycol dialkyl ether may range from about 10 to about 70 wt. %, the weight percentage of the ethyl 3-ethoxy propionate may range from about 10 to about 70 wt. %, the weight percentage of the alkyl acetate may range from about one to about 20 wt. %, and the weight percentage of the alkyl lactate may range from about one to about 20 wt. %, relative to the total weight of the solvent.

In another aspect, the invention is a thin film panel that includes: a substrate; a thin film pattern formed on the substrate; and an insulating layer formed on the thin film pattern and made from a photosensitive resin composition. The photosensitive resin composition includes an alkali-soluble resin, a quinone diazide, at least one surfactant, and a solvent. The solvent includes a diethylene glycol dialkyl ether that includes an alkyl group having one to five carbon atoms, an ethyl 3-ethoxy propionate, an alkyl acetate that includes an alkyl group having three to eight carbon atoms, and an alkyl lactate that includes an alkyl group having one to six carbon atoms.

In yet another aspect, the invention is a method of manufacturing a thin film panel. The method includes: forming a thin film pattern on a substrate; coating a photosensitive resin composition including an alkali-soluble resin, a quinone diazide, at least one surfactant, and a solvent; performing a light exposure on the photosensitive resin composition; and developing the photosensitive resin composition. The solvent includes a diethylene glycol dialkyl ether that includes an alkyl group having one to five carbon atoms, an ethyl 3-ethoxy propionate, an alkyl acetate that includes an alkyl group having three to eight carbon atoms, and an alkyl lactate that includes an alkyl group having one to six carbon atoms.

BRIEF DESCRIPTION OF THE DRAWINGS

The present invention will become more apparent by describing embodiments thereof in detail with reference to the accompanying drawing in which.

DETAILED DESCRIPTION OF EMBODIMENTS

Figure 1:
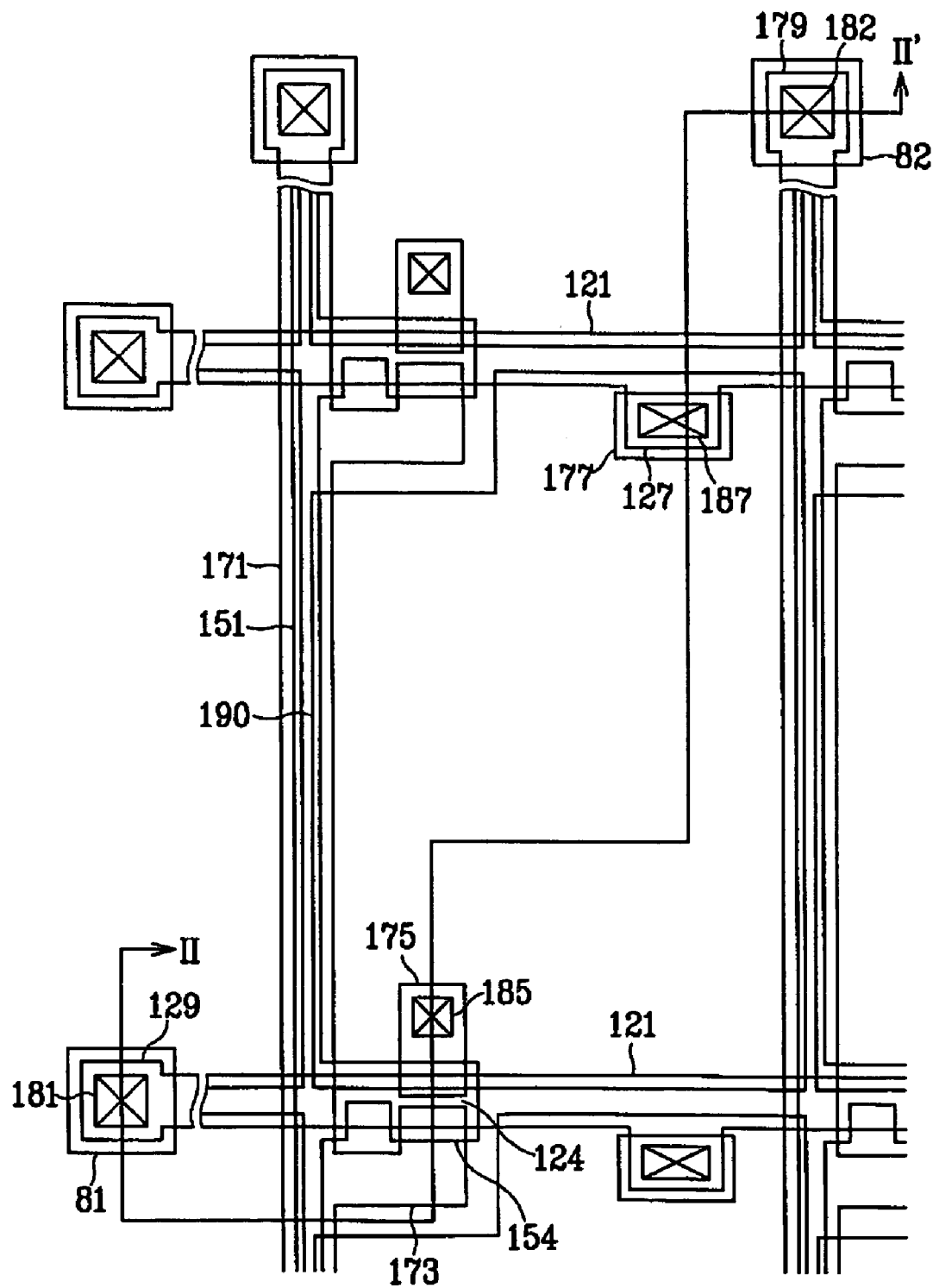
FIG. 1 is a layout view of a TFT array panel according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

A photosensitive resin composition according to the present invention includes an alkali-soluble resin, a quinone diazide, surfactants, and a solvent. The solvent includes a diethylene glycol dialkyl, an ethyl 3-ethoxy propionate, an alkyl acetate, and an alkyl lactate.

The alkali-soluble resin may include a curable copolymer that includes a compound (a1) derived from an unsaturated carboxylic acid and a compound (a2) derived from an unsaturated compound including a cross-linking group, which is not an unsaturated carboxylic acid.

The unsaturated carboxylic acid in the compound (a1) may include a molecule including one or more carboxyl groups and examples of the unsaturated carboxylic acid include an unsaturated monocarboxylic acid and an unsaturated dicarboxylic acid. The unsaturated carboxylic acid may be selected from an acrylic acid, a methacrylic acid, a crotonic acid, an itaconic acid, a maleic acid, a fumaric acid, a citraconic acid, a mesaconic acid, and a cinnamic acid.

The compound (a2) may include an unsaturated compound including an epoxy group or preferably an oxetanyl group.

Examples of the unsaturated compound including an epoxy group include a glycidyl (meth)acrylate, a β-methyl glycidyl (meth)acrylate, a β-ethyl glycidyl (meth)acrylate, a 3-methyl-3,4-epoxy butyl (meth)acrylate, a 3-ethyl-3,4-epoxybutyl (meth)acrylate, a 4-methyl-4,5-epoxy pentyl (meth)acrylate, a 2,3-epoxy cyclohexyl methyl (meth)acrylate, a 3,4-epoxy cyclohexyl methyl (meth)acrylate, an o-vinyl benzyl glycidyl ether, an m-vinyl benzyl glycidyl ether, a p-vinyl benzyl glycidyl ether, a 1-vinyl cyclohexene oxide, a 3-vinyl cyclohexene oxide, and a 4-vinyl cyclohexene oxide.

Examples of the unsaturated compound including an oxetanyl group include a 3-(meth)acryloyloxymethyl oxetane, a 3-methyl-3-(meth)acryloyloxymethyl oxetane, a 3-ethyl-3-(meth)acryloyloxymethyl oxetane, a 2-phenyl-3-(meth)acryloyloxymethyl oxetane, a 2-trifluoromethyl-3-(meth)acryloyloxymethyl oxetane, a 2-pentafluoroethyl-3-(meth)acryloyloxymethyl oxetane, a 3-methyl-3-(meth)acryloyloxyethyl oxetane, a 3-methyl-3-(meth)acryloyloxyethyl oxetane, a 2-phenyl-3-(meth)acryloyloxyethyl oxetane, a 2-trifluoromethyl-3-(meth)acryloyloxyethyl oxetane, and a 2-pentafluoroethyl-3-(meth)acryloyloxyethyl oxetane. Among the above-described oxetanes, the 3-ethyl-3-(meth)acryloyloxymethyl oxetane is preferable.

The photosensitive resin composition including the oxetanyl group is advantageous for storage of the photosensitive resin composition.

The curable copolymer may further include a compound (a3) that includes at least one selected from the group consisting of: a compound (a31) derived from a carboxylic acid ester having an olefinic double bond; an compound (a32) derived from an aromatic compound having a polymerizable, unsaturated carbon-to-carbon bond; a compound (a33) derived from a vinyl cyanide; and a compound (a34) derived from an N-substituted maleimide.

An example of the carboxylic acid ester having an olefinic double bond and deriving the compound (a31) includes a compound derived from: an unsaturated carboxylic acid ester such as a methyl (meth)acrylate, an ethyl (meth)acrylate, a butyl (meth)acrylate, a 2-hydroxyethyl (meth)acrylate, a benzyl (meth)acrylate, a cyclohexyl (meth)acrylate, an isobornyl (meth)acrylate or a dicyclopentanyl (meth)acrylate, phenyl (meth)acrylate, a diethyl maleate, a diethyl fumarate, and a diethyl itaconate; an unsaturated carboxylic acid aminoalkyl ester such as an aminoethyl (meth)acrylate; and a vinyl ester such as a vinyl acetate and a vinyl propionate.

Examples of the aromatic compound having a polymerizable, unsaturated carbon-to-carbon bond that is capable of generating the compound (a32) include a styrene, an α-methyl styrene, and a vinyl toluene.

An example of the vinyl cyanide that is capable of generating the compound (a33) includes a compound derived from a vinyl cyanide such as an acrylonitrile, a methacrylonitrile, and an α-chloro(meth)acrylonitrile.

Examples of the N-substituted maleimide deriving the compound (a34) include an N-methyl maleimide, an N-ethyl maleimide, an N-butyl maleimide, an N-cyclohexyl maleimide, an N-benzyl maleimide, an N-phenyl maleimide, an N-(4-acetylphenyl)maleimide, an N-(2,6-diethylphenyl)maleimide, an N-(4-dimethylamino-3,5-dinitrophenyl)maleimide, an N-succinimidyl-3-maleimide benzoate, an N-succinimidyl-3-maleimide propionate, an N-succinimidyl-4-maleimide butylate, an N- succinimidyl-6-maleimide caproate, an N-(1-anilinonaphthyl)-4-maleimide, an N-[4-(2-benzoxazolyl)phenyl]maleimide, and an N-(9-acridinyl) maleimide.

Each of the compounds (a1), (a2), (a31), (a32), (a33) and (a34) may include one or more compounds derived from the above-described compounds.

In the copolymer including the compound (a1) derived from the unsaturated carboxylic acid and the compound (a2) derived from the unsaturated compound including the cross-linking group, the mole fraction of the compound (a1) is equal to preferably about 5-50 mol % and more preferably about 15-40 mol % of the copolymer, and the mole fraction of the compound (a2) is equal to about 5-95 mol % and more preferably about 15-85 mol % of the copolymer.

The photosensitive resin composition including the copolymer that includes the compounds (a1) and (a2) in the amounts described above has an appropriate resolution speed for a developer and has a high curability.

In the copolymer further including the compound (a3) as well as the compounds (a1) and (a2), the mole fraction of the compound (a3) is equal to preferably about 0.01-90 mol % and more preferably about 0.01-80 mol %.

The copolymer may be formed by, for example:

(1) solution polymerization at about 60-300° C. that mixes monomers and a polymerization initiator in an organic solvent with or without a chain transfer agent as described in J. Polym. Sci., Polym. Chem. (1968),6(2), pp. 257-267;

(2) suspension or emulsion polymerization at about 60-300° C. using a solvent that does not solve monomers as described in J. Polym. Sci., Polym. Chem.(1983), 21(10), pp. 2949-2960;

(3) bulk polymerization at about 60-200° C. as described in Japanese Patent Application Publication No. Hei 6-80735; and (4) successively supplying monomers into polymerization chamber, heating the monomers at about 180-300° C. for about 5-60 minutes with or without a polymerization initiator, and extracting reaction products out of the chamber as described in Japanese Patent Application Publication No. 10-195111.

In addition, the copolymer may be obtained by mixing and reacting monomers, polymerization initiators, and an organic solvent. This mixing and reacting may be done by successively supplying monomers in an organic solvent with an additive polymerization initiator, and by successively adding monomers and an initiator to an organic solvent. In order to dissipate the heat of reaction, it is preferable to supply the monomers successively as opposed to all at once. In order to obtain polymer compounds having a narrow molecular weight distribution, it is preferable to successively supply the polymerization initiator.

The reaction is performed for preferably from about 1 to about 20 hours, and more preferably for about 2 to about 10 hours at a temperature preferably of about 40 to about 200° C., more preferably of about 50 to about 150° C., and most preferably of about 60 to about 120° C. When the monomers are successively supplied, it is preferable that the monomers are supplied for about 1 to about 5 hours and continuously heated for about 1 to about 10 hours. In this case, the reaction concentration, i.e., the weight percentage of the monomers in the total reaction solution, is preferably about 10 to about 70%, and more preferably about 20 to about 60%.

Examples of the organic solvent include:

alcohols such as a methanol, an ethanol, a propanol, a butanol, a pentanol, a hexanol, cyclohexanol;

ketones such as acetone, methyl ethyl ketone, methyl isobutyl ketone, diisobutyl ketone, cyclopentanone, and cyclohexanone;

ethers such as ethylene glycol dimethyl ether, ethylene glycol diethyl ether, ethylene glycol dipropyl ether, ethylene glycol dibutyl ether, ethylene glycol ethyl methyl ether, diethylene glycol dimethyl ether, diethylene glycol diethyl ether, diethylene glycol dipropyl ether, diethylene glycol dibutyl ether, diethylene glycol ethyl methyl ether, ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, triethylene glycol dimethyl ether, tetraethylene glycol dimethyl ether, propylene glycol monomethyl ether, dipropylene glycol monomethyl ether, dipropylene glycol monoethyl ether, dipropylene glycol dimethyl ether, dipropylene glycol diethyl ether, 3-methoxy-1-butanol, 3-methyl-3-methoxy-1-butanol;

esters such as ethyl acetate, butyl acetate, amyl acetate, methyl lactate, ethyl lactate, butyl lactate, 3-methoxy butyl acetate, 3-methyl-3-methoxy-1-butyl acetate, ethylene glycol monoethyl ether acetate, ethylene glycol monoethyl ether acetate, diethylene glycol monobutyl ether acetate, propylene glycol monomethyl ether acetate, propylene glycol monoethyl ether acetate, dipropylene glycol monomethyl ether acetate, dipropylene glycol monoethyl ether acetate, 1,3-propanediol diacetate, ethyl 3-ethoxy propionate, methyl 3-methoxy propionate, methyl 2-hydroxy isobutanate, ethylene carbonate, propylene carbonate, and butyrolactone); and aromatic hydrocarbons such as toluene and xylene.

The solvent may include two or more of the above-described compounds.

Examples of the copolymer including the compounds (a1) and (a2) include 3-ethyl-3-methacryloyloxymethyl oxetane/benzyl methacrylate/methacrylate copolymer, 3-ethyl-3-methacryloyloxymethyl oxetane/benzyl methacrylate/methacrylate/styrene copolymer, 3-ethyl-3-methacryloyloxymethyl oxetane/methacrylate/styrene copolymer, 3-ethyl-3-methacryloyloxymethyl oxetane/methacrylate/cyclohexyl methacrylate copolymer, 3-ethyl-3-methacryloyloxymethyl oxetane/methacrylate/methyl methacrylate copolymer, 3-ethyl-3-methacryloyloxymethyl oxetane/methacrylate/methyl methacrylate/styrene copolymer, 3-ethyl-3-methacryloyloxymethyl oxetane/methacrylate/t-butyl methacrylate copolymer, 3-ethyl-3-methacryloyloxymethyl oxetane/methacrylate/isobornyl methacrylate copolymer, 3-ethyl-3-methacryloyloxymethyl oxetane/benzyl acetate copolymer, 3-ethyl-3-methacryloyloxymethyl oxetane/methacrylate/cyclohexyl acrylate copolymer, 3-ethyl-3-methacryloyloxymethyl oxetane/methacrylate/isobornyl acrylate copolymer, 3-ethyl-3-methacryloyloxymethyl oxetane/methacrylate/dicyclopentanyl methacrylate copolymer, or 3-ethyl-3-methacryloyloxymethyl oxetane/methacrylate/t-butyl acrylate copolymer, 3-ethyl-3-methacryloyloxymethyl oxetane/methacrylate/phenyl maleimide copolymer, and 3-ethyl-3-methacryloyloxymethyl oxetane/methacrylate/cyclohexyl maleimide copolymer.

The average molecular weight of the copolymer including the compounds (a1) and (a2) determined by gel permeation chromatography (GPC) using a polystyrene standard is preferably about 2,000 to about 100,000, more preferably about 2,000 to about 50,000, and most preferably about 3,000 to about 20,000. When the average molecular weight is in the above-described range, the development speed is increased with maintaining the insoluble fraction.

The weight fraction of the copolymer including the compounds (a1) and (a2) is preferably about 50 to about 98 wt. %, and more preferably about 60 to about 95 wt. % relative to the solid content of the photosensitive resin composition.

The quinone diazide in the photosensitive resin composition may be selected from 1,2-benzoquinonediazide sulfonate ester, 1,2-naphthoquinone diazide sulfonate ester, 1,2-benzoquinonediazide sulfonate amide, and 1,2-naphthoquinone diazide sulfonate amide.

Examples of the quinone diazide include:

1,2-naphthoquinone diazide sulfonate esters of trihydroxybenzophen one such as 2,3,4-trihydroxybenzophenone-1,2-naphthoquinonediazide-4-sulfonate ester, 2,3,4-trihydroxybenzophenone-1,2-naphthoquinonediazide-5-sulfonate ester, 2,4,6-trihydroxybenzophenone-1,2-naphthoquinonediazide-4-sulfonate ester, and 2,4,6-trihydroxybenzophenone-1,2-naphthoquinonediazide-5-sulfonate ester;

1,2-naphthoquinone diazide sulfonate esters of tetrahydroxybenzophenone such as 2,2',4,4'-tetrahydroxybenzophenone-1,2-naphthoquinonediazide-4-sulfonate ester, 2,2',4,4'-tetrahydroxybenzophenone-1,2-naphthoquinonediazide-5-sulfonate ester, 2,2',4,3'-tetrahydroxybenzophenone-1,2-naphthoquinonediazide-4-sulfonate ester, 2,2',4,3'-tetrahydroxybenzophenone-1,2-naphthoquinonediazide-5-sulfonate ester, 2,3,4,4'-tetrahydroxybenzophenone-1,2-naphthoquinonediazide-4-sulfonate ester, 2,3,4,4'-tetrahydroxybenzophenone-1,2-naphthoquinonediazide-5-sulfonate ester, 2,3,4,2'-tetrahydroxybenzophenone-1,2-naphthoquinonediazide-4-sulfonate ester, 2,3,4,2'-tetrahydroxybenzophenone-1,2-naphthoquinonediazide-5-sulfonate ester, 2,3,4,4'-tetrahydroxy-3'-methoxybenzophenone-1,2-naphthoquinonediazide-4-sulfonate ester, and 2,3,4,4'-tetrahydroxy-3'-methoxybenzophenone -1,2-naphthoquinonediazide-5-sulfonate ester;

1,2-naphthoquinone diazide sulfonate esters of pentahydroxybenzophenone such as 2,3,4,2',6'-pentahydroxybenzophenone-1,2-naphthoquinonediazide-4-sulfonate ester and 2,3,4,2',6'-pentahydroxybenzophenone -1,2-naphthoquinonediazide-5-sulfonate ester;

1,2-naphthoquinone diazide sulfonate esters of hexahydroxybenzophenone such as 2,4,6,3',4',5'-hexahydroxybenzophenone-1,2-naphthoquinonediazide-4-sulfonate ester, 2,4,6,3',4',5'-hexahydroxybenzophenone-1,2-naphthoquinonediazide-4-sulfonate ester, 3,4,5,3',4',5'-hexahydroxybenzophenone-1,2-naphthoquinonediazide-4-sulfonate ester, and 3,4,5,3',4',5'-hexahydroxybenzophenone-1,2-naphthoquinonediazide-5-sulfonate ester;

1,2-naphthoquinone diazide sulfonate esters of (polyhydroxyphenyl)alkane such as bis(2,4-dihydroxyphenyl)methane-1,2-naphthoquinonediazide-4-sulfonate ester, bis(2,4-dihydroxyphenyl)methane-1,2-naphthoquinonediazide-5-sulfonate ester, bis(p-hydroxyphenyl)methane-1,2-naphthoquinonediazide-4-sulfonate ester, bis(p-hydroxyphenyl)methane-1,2-naphthoquinonediazide-5-sulfonate ester, 1,1,1-tri(p-hydroxyphenyl)ethane-1,2-naphthoquinonediazide-4-sulfonate ester, 1,1,1-tri(p-hydroxyphenyl)ethane-1,2-naphthoquinonediazide-5-sulfonate ester, bis(2,3,4-trihydroxyphenyl)methane-1,2-naphthoquinonediazide-4-sulfonate ester, bis(2,3,4-trihydroxyphenyl)methane-1,2-naphthoquinonediazide-5-sulfonate ester, 2,2'-bis(2,3,4-trihydroxyphenyl)propane-1,2-naphthoquinonediazide-4-sulfonate ester, 2,2'-bis(2,3,4-trihydroxyphenyl) propane-1,2-naphthoquinonediazide-5-sulfonate ester, 1,1,3-tris(2,5-dimethyl-4-hydroxyphenyl)-3-phenylpropane-1,2-naphthoquinonediazide -4-sulfonate ester, 1,1,3-tris(2,5-dimethyl-4-hydroxyphenyl)-3-phenylpropane-1,2-naphthoquinonediazide -5-sulfonate ester, 4,4'-[-[4-[1-[4-hydroxyphenyl]-1-methylethyl]phenyl]ethylidene])bisphenol-1,2-naphthoquinonediazide-5-sulfonate ester, bis(2,5-dimethyl-4-hydroxyphenyl)-2-hydroxyphenylmethane-1,2-naphthoquinonediazide-4-sulfonate ester, bis(2,5-dimethyl-4-hydroxyphenyl)-2-hydroxyphenylmethane-1,2-naphthoquinonediazide-5-sulfonate ester, 3,3,3',3'-tetramethyl-1,1'-spirobindene-5,6,7,5',6',7'-hexanol-1,2-naphthoquinonediazide-4-sulfonate ester, 3,3,3',3'-tetramethyl-1,1'-spirobindene-5,6,7,5',6',7'-hexanol-1,2-naphthoquinonediazide-5-sulfonate ester, 2,2,4-trimethyl-7,2',4'-trihydroxyflavan-1,2-naphthoquinonediazide-4-sulfonate ester, and 2,2,4-trimethyl-7,2',4'-trihydroxyflavan-1,2-naphthoquinonediazide-5-sulfonate ester.

The photosensitive resin composition may include two or more of the above-described quinone diazides.

The weight fraction of the quinone diazide is preferably about 2 to about 50 wt. %, and more preferably about 5 to about 40 wt. % relative to the weight of the solid content of the photosensitive resin composition. In this case, the difference in the resolution speed between exposed portions and unexposed portions of the photosensitive resin composition becomes large to increase the insoluble fraction.

The surfactants may include an organic fluorosurfactant and silicone surfactants with or without fluorine atoms.

The organic fluorosurfactant may have Chemical Formula 1:

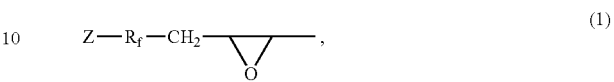

where $R_f$ is a chained or branched perfluoroalkylene group including about 5-10 carbon atoms and Z is a hydrogen or a fluorine.

Examples of $R_f$ of the organic fluorosurfactant include perfluoro n-pentylene group, perfluoro n-hexylene group, perfluoro n-heptylene group, perfluoro n-octylene group, perfluoro n-nonylene group, perfluoro n-decylene group, and perfluoro 2-ethylhexylene group. Among the above-described perfluoroalkylene groups, perfluoro n-hexylene group, perfluoro n-octylene group, and perfluoro n-decylene group are preferred.

Examples of the organic fluorosurfactant include 3-perfluorohexyl-1,2-epoxypropane, 3-perfluorooctyl-1,2-epoxypropane, and 3-perfluorodecyl-1,2-epoxypropane. Among the above-listed examples, 3-perfluorooctyl-1,2-epoxypropane is preferred.

The concentration of the organic fluorosurfactant is preferably about 1 to about 1,000 ppm, more preferably about 10 to about 500 ppm, and most preferably about 50 to about 300 ppm relative to the total content of the photosensitive resin composition. With this composition, the photosensitive resin can form a film having reduced stains.

The weight fraction of the organic fluorosurfactant is preferably about 10 to about 50 wt. % relative to the total weight content of the organic fluorosurfactant and the silicone surfactants.

The silicone surfactants include the first silicone surfactant having Chemical Formula 2 and the second silicone surfactant having Chemical Formula 3:

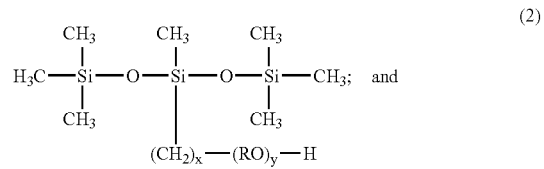

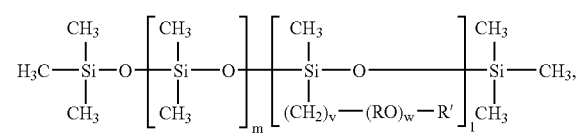

where R is a chained or branched alkylene group including about 2-5 carbon atoms, each of x and y is an integer of about 1-20, R' is an alkyl group including about 1-20 carbon atoms or a chained or branched carbonyl alkyl group including about 2-21 carbon atoms, each of v and w is an integer of 1-20, and each of m and l is an integer of about 1-9 wherein (m+l) lies between 2 and 10.

Examples of R include ethylene group, n-propylene group, n-butylene group, pentamethylene group, isopropylene group, 2-methyl n-propylene group, 3-methyl n-propylene group, 2-methyl n-butylene group, 3-methyl n-butylene group, and 2,2-dimethyl n-propylene group. Among the above-listed groups, ethylene group, n-propylene group, and isopropylene group are preferred.

The integer x ranges preferably from two to six, and the integer y ranges preferably from 5 to 10.

Any combination of x and y in the above-described ranges can be selected and any combination of x and y range in the above-described preferable ranges is preferred.

An example of the first silicone surfactant includes a reaction product of methyl hydro bis(trimethyl siloxy)silane and polyalkylene glycol monoallyl ether preferably having a molecular weight from about 200 to about 500.

The concentration of the first silicone surfactant is preferably from about 1 to about 1,000 ppm, more preferably from about 10 to about 500 ppm, and most preferably from about 50 to about 300 ppm relative to the total content of the photosensitive resin composition, such that a film made of the photosensitive resin composition has reduced stains.

Examples of R' in Chemical Formula 3 include methyl group, ethyl group, n-propyl group, n-butyl group, n-pentyl group, n-hexyl group, n-heptyl group, n-octyl group, n-nonyl group, n-decyl group, n-dodecyl group, n-undecyl group, n-tetradecyl group, n-hexadecyl group, n-octadecyl group, isopropyl group, sec-butyl group, tert-butyl group, 2-methyl hexyl group, carbonyl methyl group, carbonyl ethyl group, carbonyl n-propyl group, carbonyl n-butyl group, carbonyl n-pentyl group, carbonyl n-hexyl group, carbonyl n-heptyl group, carbonyl n-octyl group, carbonyl n-nonyl group, carbonyl n-decyl group, carbonyl n-dodecyl group, carbonyl n-undecyl group, carbonyl n-tetradecyl group, carbonyl n-hexadecyl group, carbonyl n-octadecyl group, carbonyl isopropyl group, carbonyl sec-butyl group, carbonyl tert-butyl group, and carbonyl 2-methylhexyl group. Among the above-listed groups, methyl group, ethyl group, n-propyl group, n-butyl group, n-pentyl group, n-hexyl group, n-octyl group, n-decyl group, n-undecyl group, n-tetradecyl group, n-hexadecyl group, n-octadecyl group, isopropyl group, sec-butyl group, tert-butyl group, 2-methyl hexyl group, carbonyl methyl group, carbonyl ethyl group, carbonyl n-propyl group, carbonyl n-butyl group, carbonyl n-hexyl group, carbonyl n-octyl group, carbonyl n-decyl group, carbonyl n-undecyl group, carbonyl n-tetradecyl group, carbonyl n-hexadecyl group, carbonyl n-octadecyl group, carbonyl isopropyl group, carbonyl sec-butyl group, carbonyl tert-butyl group, and carbonyl 2-methylhexyl group.

The integer v ranges preferably from two to six, and the integer w ranges preferably from five to ten.

Any combination of v and w in the above-described ranges can be selected and any combination of v and w range in the above-described preferable ranges is preferred.

The integer m ranges preferably from one to ten, and the integer I ranges preferably from one to ten.

Any combination of m and I in the above-described ranges can be selected and any combination of m and I range in the above-described preferable ranges is preferred.

An example of the second silicone surfactant includes an addition product of trimethylsilyl terminated-(dimethylsiloxane-methylhydrosiloxane) copolymer and carboxylic acid ester of polyalkylene glycol allyl alkyl ether or polyalkylene glycol allyl ether, and preferably includes an addition product of trimethylsilyl terminated-(dimethylsiloxane-methylhydrosiloxane) copolymer and carboxylic acid ester of polyethylene glycol allyl alkyl ether and polyethylene glycol allyl ether.

The concentration of the second silicone surfactant is preferably from about 1 to about 1,000 ppm, more preferably from about 10 to about 500 ppm, and most preferably from about 50 to about 300 ppm relative to the total content of the photosensitive resin composition, such that a film made of the photosensitive resin composition has reduced stains.

The surfactants including the organic fluorosurfactant and the first and the second silicone surfactants are preferably from about 3 to about 3,000 ppm, more preferably from about 5 to about 800 ppm, and most preferably from about 10 to about 800 ppm relative to the total content of the photosensitive resin composition, such that a film made of the photosensitive resin composition has reduced stains.

The weight fraction of the alkali-soluble resin, the quinone diazide, and the surfactants is from about 50 to about 98 wt. %, from about 2 to about 50 wt. %, and from about 3 to about 3,000 ppm, respectively, relative to the total solid content of the photosensitive resin composition not including the solvent.

The solvent for solving the alkali-soluble resin, the quinone diazide, and the surfactants includes a diethylene glycol dialkyl ether including an alkyl group that has 1-5 carbon atoms, an ethyl 3-ethoxy propionate, and an alkyl acetate including an alkyl group that includes 3-8 carbon atoms, and an alkyl lactate 1-6 carbon atoms.

The mixture of the alkali-soluble resin, the quinone diazide, and the surfactants with the solvent has improved spreading when being coated and it has appropriate evaporation speed.

Examples of the diethylene glycol dialkyl ether in the solvent, which includes an alkyl group including 1-5 carbon atoms, include diethylene glycol dimethyl ether, diethylene glycol diethyl ether, diethylene glycol di-n-propyl ether, diethylene glycol diisopropyl ether, diethylene glycol di-n-butyl ether, diethylene glycol di-sec-butyl ether, diethylene glycol di-tert-butyl ether, diethylene glycol di-n-pentyl ether, diethylene glycol methyl ethyl ether, diethylene glycol methyl n-propyl ether, diethylene glycol methyl isopropyl ether, diethylene glycol methyl n-butyl ether, diethylene glycol methyl sec-butyl ether, diethylene glycol methyl tert-butyl ether, diethylene glycol methyl n-pentyl ether, diethylene glycol ethyl n-propyl ether, diethylene glycol ethyl isopropyl ether, diethylene glycol ethyl n-butyl ether, diethylene glycol ethyl sec-butyl ether, diethylene glycol ethyl tert-butyl ether, diethylene glycol ethyl n-pentyl ether, diethylene glycol n-propyl isopropyl ether, diethylene glycol n-propyl n-butyl ether, diethylene glycol n-propyl sec-butyl ether, diethylene glycol n-propyl tert-butyl ether, diethylene glycol n-propyl n-pentyl ether, diethylene glycol isopropyl n-butyl ether, diethylene glycol isopropyl sec-butyl ether, diethylene glycol isopropyl tert-butyl ether, diethylene glycol isopropyl n-pentyl ether, diethylene glycol n-butyl sec-butyl ether, diethylene glycol n-butyl tert-butyl ether, diethylene glycol n-butyl n-pentyl ether, and diethylene glycol sec-butyl tert-butyl ether, and diethylene glycol sec-butyl n-pentyl ether. Among the above-listed compounds, diethylene glycol dimethyl ether, diethylene glycol diethyl ether, diethylene glycol di-n-propyl ether, diethylene glycol diisopropyl ether, diethylene glycol di-n-butyl ether, diethylene glycol methyl ethyl ether, diethylene glycol methyl n-propyl ether, diethylene glycol methyl isopropyl ether, diethylene glycol methyl n-butyl ether, diethylene glycol methyl sec-butyl ether, diethylene glycol methyl tert-butyl ether, diethylene glycol ethyl n-propyl ether, diethylene glycol ethyl isopropyl ether, diethylene glycol ethyl n-butyl ether, and diethylene glycol ethyl sec-butyl ether, diethylene glycol tert-butyl ether are preferred. In particular, diethylene glycol di-n-propyl ether, diethylene glycol diisopropyl ether, diethylene glycol methyl n-butyl ether, diethylene glycol methyl sec-butyl ether, diethylene glycol methyl tert-butyl ether, diethylene glycol ethyl n-butyl ether, diethylene glycol sec-butyl ether, and diethylene glycol ethyl tert-butyl ether are preferable.

Examples of the alkyl acetate in the solvent include n-propyl acetate, isopropyl acetate, n-butyl acetate, isobutyl acetate, sec-butyl acetate, tert-butyl acetate, n-pentyl acetate, 2-pentyl acetate, 3-pentyl acetate, neopentyl acetate, n-hexyl acetate, 2-hexyl acetate, 3-hexyl acetate, 2-methyl pentyl acetate, 3-methyl pentyl acetate, n-heptyl acetate, 2-heptyl acetate, 3-heptyl acetate, 4-heptyl acetate, n-octyl acetate, 2-octyl acetate, 3-octyl acetate, 4-octyl acetate, and 2-ethyl hexyl acetate. Examples of the alkyl lactate in the solvent include methyl lactate, ethyl lactate, n-propyl lactate, isopropyl lactate, n-butyl lactate, isobutyl lactate, sec-butyl lactate, tert-butyl lactate, n-pentyl lactate, 2-pentyl lactate, 3-pentyl lactate, neopentyl lactate, n-hexyl lactate, 2-hexyl lactate, 3-hexyl lactate, 2-methyl lactate, and 3-methyl pentyl lactate.

The weight fractions of the diethylene glycol dialkyl ether, the ethyl 3-ethoxy propionate, the alkyl acetate, and the alkyl lactate are about 10 to about 70 wt. %, about 10 to about 70 wt. %, about 1 to about 20 wt. %, about 1 to about 20 wt. %, respectively, more preferably from about 20 to about 60 wt. %, about 20 to about 60 wt. %, about 2 to about 15 wt. %, from about 2 to about 15 wt. %, respectively, and most preferably from about 30 to about 50 wt. %, from about 30 to about 50 wt. %, from about 3 to about 12 wt. %, from about 3 to about 12 wt. %, respectively, relative to the total content of the photosensitive resin composition. With this composition, the photosensitive resin can form a film having reduced stains.

The solvent may be used along with an organic solvent, examples of which include:

ethylene glycol monoalkyl ethers such as ethylene glycol monomethyl ether, ethylene glycol monoethyl ether, ethylene glycol monopropyl ether, and ethylene glycol monobutyl ether;

ethylene glycol alkyl ether esters such as methyl cellosolve acetate and ethyl cellosolve acetate;

propylene glycol monoalkyl ether acetates such as propylene glycol monomethyl ether acetate, propylene glycol monoethyl ether acetate, propylene glycol monopropyl ether acetate, dipropylene glycol monomethyl ether acetate, and dipropylene glycol monoethyl ether acetate;

aromatic hydrocarbons such as benzene, toluene, xylene, and mesitylene;

ketones such as methyl ethyl ketone, acetone, methyl amyl ketone, methyl isobutyl ketone, and cyclohexanone;

alcohols such as ethanol, propanol, butanol, hexanol, cyclohexanol, ethylene glycol, and glycerin; and esters such as methyl 3-methoxy propionate, methyl 2-hydroxy isobutanate, ethyl lactate, amyl acetate, methyl pyrophosphate, and 1,3-butanediol diacetate.

The weight fraction of the solvent is preferably from about 50 to about 95 wt. %, and more preferably from about 70 to about 90 wt. % relative to the total weight content of the photosensitive resin composition. The weight fraction of the solvent used in a coating device having slit-type nozzles is preferably from about 75 wt. % to about 90 wt. % relative to the total weight content of the photosensitive resin composition. As for the weight fraction of the solvent used in a coating device performing spin coating as well as slit coating, it is preferably from about 65 to about 80 wt. % relative to the total weight content of the photosensitive resin composition. With this composition, the photosensitive resin can form a film having reduced stains.

The photosensitive resin composition may further include a cationic polymerization initiator, a polyphenol, a cross-linking agent, a polymerizable monomer, and a silane coupling agent as well as the alkali-soluble resin, the quinone diazide, the surfactants, and the solvent.

An example of the cationic polymerization initiator includes an onium salt that can initiate the cationic polymerization. The onium salt includes an onium cation and a Lewis acid anion.

Examples of the onium cation include diphenyl iodonium, bis(p-tolyl)iodonium, bis(p-t-butylphenyl)iodonium, bis(p-octylphenyl)iodonium, bis(p-octadecylphenyl)iodonium, bis(p-octyloxyphenyl)iodonium, bis(p-octadecyloxyphenyl)iodonium, phenyl(p-octadecyloxyphenyl)iodonium, p-tolyl)(p-isopropyl phenyl)iodonium, triphenyl sulfonate, tris(p-tolyl)sulfonate, tris(p-isopropyl phenyl)sulfonate, tris(2,6-dimethyl phenyl)sulfonate, tris(p-t-butylphenyl)sulfonate, tris(p-cyanophenyl)sulfonate, tris(p-chlorophenyl)sulfonate, dimethyl(methoxy)sulfonate, dimethyl(ethoxy)sulfonate, dimethyl(propoxy)sulfonate, dimethyl(butoxy)sulfonate, dimethyl(octyloxy)sulfonate, dimethyl(octadecanoxy)sulfonate, dimethyl(isopropoxy)sulfonate, dimethyl(t-butoxy)sulfonate, dimethyl(cyclopentyloxy)sulfonate, dimethyl(cyclohexyloxy)sulfonate, dimethyl(fluoromethoxy)sulfonate, dimethyl(2-chloroethoxy)sulfonate, dimethyl(3-bromopropoxy)sulfonate, dimethyl(4-cyanobutoxy)sulfonate, dimethyl(8-nitrooctyloxy)sulfonate, dimethyl(18-trifluoromethyloctadecanoxy)sulfonate, dimethyl(2-hydroxy isopropoxy)sulfonate, and dimethyl(tris(trichloromethyl)methyl)sulfonate. Among the above-listed onium cations, bis(p-tolyl)iodonium, p-tolyl)(p-isopropyl phenyl) iodonium, bis(p-t-butylphenyl)iodonium, triphenyl sulfonate, and tris(p-t-butylphenyl)sulfonate are preferred.

Examples of the Lewis acid anions include hexafluoro phosphate and hexafluoro arsenate, and preferably include hexafluoro antimonate and tetrakis(pentafluorophenyl)borate.

Any combination of the above-listed onium cations and Lewis acid anions can be employed.

Examples of the cationic polymerization initiator include diphenyliodonium hexafluorophosphate, bis(p-tolyl)iodonium hexafluorophosphate, bis(p-t-butylphenyl)iodonium hexafluorophosphate, bis(p-octylphenyl)iodonium hexafluorophosphate, bis(p-octadecylphenyl)iodonium hexafluorophosphate, bis(p-octyloxyphenyl)iodonium hexafluorophosphate, bis(p-octadecyloxyphenyl)iodonium hexafluorophosphate, phenyl(p-octadecyloxyphenyl)iodonium hexafluorophosphate, p-tolyl) (p-isopropyl phenyl) iodonium hexafluorophosphate, methyl naphthyl iodonium hexafluorophosphate, ethyl naphthyl iodonium hexafluorophosphate, triphenyl sulfonate hexafluoro phosphate, tris(p-tolyl)sulfonate hexafluoro phosphate, tris(p-isopropyl phenyl)sulfonate hexafluoro phosphate, tris(2,6-dimethyl phenyl)sulfonate hexafluoro phosphate, tris(p-t-butyl phenyl)sulfonate hexafluoro phosphate, tris(p-cyanophenyl)sulfonate hexafluoro phosphate, tris(p-chlorophenyl)sulfonate hexafluoro phosphate, dimethyl naphthyl sulfonate hexafluoro phosphate, diethyl naphthyl sulfonate hexafluoro phosphate, dimethyl(methoxy) sulfonate hexafluoro phosphate, dimethyl ethoxy sulfonate hexafluoro phosphate, dimethyl(propoxy) sulfonate hexafluoro phosphate, dimethyl (butoxy) sulfonate hexafluoro phosphate, dimethyl (octyloxy)sulfonate hexafluoro phosphate, dimethyl(octadecanoxy)sulfonate hexafluoro phosphate, dimethyl (isopropoxy)sulfonate hexafluoro phosphate, dimethyl(t-butoxy)sulfonate hexafluoro phosphate, dimethyl (cyclopentyloxy)sulfonate hexafluorophosphate, dimethyl (cyclohexyloxy)sulfonate hexafluorophosphate, dimethyl (fluoromethoxy)sulfonate hexafluorophosphate, dimethyl(2-chloroethoxy)sulfonate hexafluorophosphate, dimethyl(3-bromopropoxy)sulfonate hexafluorophosphate, dimethyl(4-cyanobutoxy)sulfonate hexafluorophosphate, dimethyl(8-nitrooctyloxy) sulfonate hexafluorophosphate, dimethyl(18-trifluoromethyloctadecanoxy)sulfonate hexafluorophosphate, dimethyl(2-hydroxyisopropoxy)sulfonate hexafluorophosphate, dimethyl(tris(trichloromethyl) methyl)sulfonate hexafluorophosphate, diphenyliodonium hexafluoroarsenate, bis(p-tolyl)iodonium hexafluoroarsenate, bis(p-octylphenyl)iodonium hexafluoroarsenate, bis(p-octadecylphenyl)iodonium hexafluoroarsenate, bis(p-octyloxyphenyl) iodonium hexafluoroarsenate, bis(p-octadecyloxyphenyl)iodonium hexafluoroarsenate, phenyl (p-octadecyloxyphenyl)iodonium hexafluoroarsenate, (p-tolyl)(p-isopropylphenyl)iodonium hexafluoroarsenate, methyl naphthyl iodonium hexafluoroarsenate, ethyl naphthyl iodonium hexafluoroarsenate, triphenyl sulphonate hexafluoroarsenate, tris(p-tolyl)sulphonate hexafluoroarsenate, tris(p-isopropylphenyl)sulphonate hexafluoroarsenate, tris(2,6-dimethylphenyl)sulphonate hexafluoroarsenate, tris (p-t-butylphenyl)sulphonate hexafluoroarsenate, tris(p-cyanophenyl)sulphonate hexafluoroarsenate, tris(p-chlorophenyl)sulphonate hexafluoroarsenate, dimethyl naphthyl sulphonate hexafluoroarsenate, diethyl naphthyl sulphonate hexafluoroarsenate, dimethyl(methoxy)sulphonate hexafluoroarsenate, dimethyl(ethoxy)sulphonate hexafluoroarsenate, dimethyl(propoxy)sulphonate hexafluoroarsenate, dimethyl(butoxy)sulphonate hexafluoroarsenate, dimethyl(octyloxy)sulphonate hexafluoroarsenate, dimethyl (octadecanoxy)sulphonate hexafluoroarsenate, dimethyl (isopropoxy)sulphonate hexafluoroarsenate, dimethyl(t-butoxy)sulphonate hexafluoroarsenate, dimethyl (cyclopentyloxy)sulphonate hexafluoroarsenate, dimethyl (cyclohexyloxy)sulphonate hexafluoroarsenate, dimethyl (fluoromethoxy)sulphonate hexafluoroarsenate, dimethyl(2-chloroethoxy)sulphonate hexafluoroarsenate, dimethyl(3-bromopropoxy)sulphonate hexafluoroarsenate, dimethyl(4-cyanobutoxy)sulphonate hexafluoroarsenate, dimethyl(8-nitrooctyloxy)sulphonate hexafluoroarsenate, dimethyl(18-trifluoromethyloctadecanoxy)sulphonate hexafluoroarsenate, dimethyl(2-hydroxyisopropoxy)sulphonate hexafluoroarsenate, dimethyl(tris(trichloromethyl)methyl)sulphonate hexafluoroarsenate, diphenyl iodonium hexafluoroantimonate, bis(p-tolyl)iodonium hexafluoroantimonate, bis(p-t-butylphenyl)iodonium hexafluoroantimonate, bis(p-octylphenyl)iodonium hexafluoroantimonate, bis(p-octadecylphenyl)iodonium hexafluoroantimonate, bis (p-octyloxyphenyl)iodonium hexafluoroantimonate, bis(p-octadecyloxyphenyl)iodonium hexafluoroantimonate, bis(p-octadecyloxyphenyl)iodonium hexafluoroantimonate, (p-tolyl)(p-isopropylphenyl)iodonium hexafluoroantimonate, methyl naphthyl iodonium hexafluoroantimonate, ethyl naphthyl iodonium hexafluoroantimonate, triphenyl sulfonate hexafluoroantimonate, tris(p-tolyl)sulfonate hexafluoroantimonate, tris(p-isopropylphenyl)sulfonate hexafluoroantimonate, tris(2,6-dimethylphenyl)sulfonate hexafluoroantimonate, tris(p-t-butylphenyl)sulfonate hexafluoroantimonate, tris(p-cyanophenyl)sulfonate hexafluoroantimonate, tris(p-chlorophenyl)sulfonate hexafluoroantimonate, dimethyl naphthyl sulfonate hexafluoroantimonate, diethyl naphthyl sulfonate hexafluoroantimonate, dimethyl(methoxy)sulfonate hexafluoroantimonate, dimethyl(ethoxy)sulfonate hexafluoroantimonate, dimethyl(propoxy)sulfonate hexafluoroantimonate, dimethyl(butoxy) sulfonate hexafluoroantimonate, dimethyl(octyloxy) sulfonate hexafluoroantimonate, dimethyl(octadecanoxy)sulfonate hexafluoroantimonate, dimethyl(isopropoxy) sulfonate hexafluoroantimonate, dimethyl(t-butoxy) sulfonate hexafluoroantimonate, dimethyl(cyclopentyloxy) sulfonate hexafluoroantimonate, dimethyl(cyclohexyloxy) sulfonate hexafluoroantimonate, dimethyl(fluoromethoxy) sulfonate hexafluoroantimonate, dimethyl(2-chloroethoxy) sulfonate hexafluoroantimonate, dimethyl(3-bromopropoxy)sulfonate hexafluoroantimonate, dimethyl (4-cyanobutoxy)sulfonate hexafluoroantimonate, dimethyl (8-nitrooctyloxy)sulfonate hexafluoroantimonate, dimethyl (18-trifluoromethyloctadecanoxy)sulfonate hexafluoroantimonate, dimethyl(2-hydroxyisopropoxy)sulfonate hexafluoroantimonate, dimethyl(tris(trichloromethyl) methyl)sulfonate hexafluoroantimonate, diphenyl iodonium tetrakis(pentafluorophenyl)borate, bis(p-tolyl)iodonium tetrakis(pentafluorophenyl)borate, bis(p-t-butylphenyl)iodonium tetrakis(pentafluorophenyl)borate, bis(p-octylphenyl) iodonium tetrakis(pentafluorophenyl)borate, bis(p-octadecylphenyl)iodonium tetrakis(pentafluorophenyl) borate, bis(p-octyloxyphenyl)iodonium tetrakis (pentafluorophenyl)borate, bis(p-octadecyloxyphenyl) iodonium tetrakis(pentafluorophenyl)borate, phenyl(p-octadecyloxyphenyl)iodonium tetrakis(pentafluorophenyl) borate, (p-tolyl)(p-isopropylphenyl)iodonium tetrakis (pentafluorophenyl)borate, methyl naphthyl iodonium tetra kis(pentafluorophenyl)borate, ethyl naphthyl iodonium tetrakis(pentafluorophenyl)borate, triphenyl sulfonate tetrakis (pentafluorophenyl)borate, tris(p-tolyl)sulfonate tetrakis (pentafluorophenyl)borate, tris(p-isopropylphenyl)sulfonate tetrakis(pentafluorophenyl)borate, tris(2,6-dimethylphenyl) sulfonate tetrakis(pentafluorophenyl)borate, tris(p-t-butylphenyl)sulfonate tetrakis(pentafluorophenyl)borate, tris (p-cyanophenyl)sulfonate tetrakis(pentafluorophenyl) borate, tris(p-chlorophenyl)sulfonate tetrakis (pentafluorophenyl)borate, dimethyl naphthyl sulfonate tetrakis(pentafluorophenyl)borate, diethyl naphthyl sulfonate tetrakis(pentafluorophenyl)borate, dimethyl(methoxy)sulfonate tetrakis(pentafluorophenyl)borate, dimethyl (ethoxy)sulfonate tetrakis(pentafluorophenyl)borate, dimethyl(propoxy)sulfonate tetrakis(pentafluorophenyl)borate, dimethyl(butoxy)sulfonate tetrakis(pentafluorophenyl) borate, dimethyl(octyloxy)sulfonate tetrakis(pentafluorophenyl) borate, dimethyl(octadecanoxy)sulfonate tetrakis (pentafluorophenyl)borate, dimethyl(isopropoxy)sulfonate tetrakis(pentafluorophenyl)borate, dimethyl(t-butoxy)sulfonate tetrakis(pentafluorophenyl)borate, dimethyl(cyclopentyloxy)sulfonate tetrakis(pentafluorophenyl)borate, dimethyl(cyclohexyl oxy)sulfonate tetrakis(pentafluorophenyl) borate, dimethyl(fluoromethoxy)sulfonate tetrakis (pentafluorophenyl)borate, dimethyl(2-chloroethoxy) sulfonate tetrakis(pentafluorophenyl)borate, dimethyl(3-bromopropoxy)sulfonate tetrakis(pentafluorophenyl)borate, dimethyl(4-cyanobutoxy)sulfonate tetrakis(pentafluorophenyl)borate, dimethyl(8-nitrooctyloxy) sulfonate tetrakis (pentafluorophenyl)borate, dimethyl(18-trifluoromethyloctadecanoxy)sulfonate tetrakis(pentafluorophenyl)borate, dimethyl(2-hydroxyisopropoxy)sulfonate tetrakis(pentafluorophenyl)borate, and dimethyl(tris(trichloromethyl) methyl)sulfonate tetrakis(pentafluorophenyl)borate. Among the above-listed cationic polymerization initiators, preferred are bis(p-tolyl)iodonium hexafluorophosphate, (p-tolyl)(p-isopropylphenyl)iodonium hexafluorophosphate, bis(p-t-butylphenyl)iodonium hexafluorophosphate, triphenyl sulfonate hexafluorophosphate, tris(p-t-butylphenyl)sulfonate hexafluorophosphate, bis(p-tolyl)iodonium hexafluoroarsenate, (p-tolyl)(p-isopropylphenyl)iodonium hexafluoroarsenate, bis(p-t-butylphenyl)iodonium hexafluoroarsenate, triphenyl sulfonate hexafluoroarsenate, tris(p-t-butylphenyl)sulfonate hexafluoroarsenate, bis(p-tolyl)iodonium hexafluoroantimonate, (p-tolyl)(p-isopropylphenyl)iodonium hexafluoroantimonate, bis(p-t-butylphenyl)iodonium hexafluoroantimonate, trisphenyl sulfonate hexafluoroantimonate, tris(p-t-butylphenyl)sulfonate hexafluoroantimonate, bis(p-tolyl)iodonium tetrakis(pentafluorophenyl)borate, (p-tolyl) (p-isopropylphenyl)iodonium tetrakis (pentafluorophenyl)borate, bis(p-t-butylphenyl)iodonium tetrakis(pentafluorophenyl)borate, triphenyl sulfonate tetrakis(pentafluorophenyl)borate, and tris(p-t-butylphenyl)sulfonate tetrakis(pentafluorophenyl)borate, and more preferred are bis(p-tolyl)iodonium hexafluoroantimonate, (p-tolyl)(p-isopropylphenyl)iodonium hexafluoroantimonate, bis(p-t-butylphenyl)iodonium hexafluoroantimonate, trisphenyl sulfonate hexafluoroantimonate, tris(p-t-butylphenyl)sulfonate hexafluoroantimonate, bis(p-tolyl)iodonium tetrakis(pentafluorophenyl)borate, (p-tolyl) (p-isopropylphenyl)iodonium tetrakis(pentafluorophenyl)borate, bis(p-t-butylphenyl)iodonium tetrakis(pentafluorophenyl) borate, triphenyl sulfonate tetrakis(pentafluorophenyl)borate, and tris(p-t-butylphenyl)sulfonate tetrakis (pentafluorophenyl)borate.

The weight fraction of the cationic polymerization initiator is preferably from about 0.01 to about 10 wt %, and more preferably from about 0.1 to about 5 wt. % relative to the total solid content of the photosensitive resin composition. The photosensitive resin composition including the polymerization initiator in the above-described range has increased thermal curing rate, the reduction of the resolution during the thermal curing is suppressed, and the cured film has increased solvent resistance.

The polyphenol includes a compound including molecules that includes two or more phenolic hydroxyl group, a polymer polymerized from hydroxystyrene at least, or a novolac resin.

Examples of the compound, which includes molecules including two or more phenolic hydroxyl group, include trihydroxybenzophenones, tetrahydroxybenzophenones, pentahydroxybenzophenones, hexahydroxybenzophenones, and (polyhydroxyphenyl)alkanes, which are illustrated in the description of the quinone diazide.

Examples of the polymer polymerized from hydroxystyrene at least include a resin polymerized from hydroxystyrene such as polyhydroxystyrene, hydroxystyrene/methylmethacrylate copolymer, hydroxystyrene/cyclohexyl methacrylate copolymer, hydroxystyrene/styrene copolymer, and hydroxystyrene/alkoxystyrene copolymer.

An example of the novolac resin may be obtained by condensation polymerization of at least one of phenols, cresols, and catechols and at least one of aldehydes and ketones.

The polyphenol makes up preferably about 0.01 to about 40 wt. %, and more preferably about 0.1 to about 25 wt. % of the total solid weight content of the photosensitive resin composition, such that the resolution is increased and the reduction of the transmittance of the visible light is prevented.

An example of the cross-linking agent includes a methylol compound. The methylol compound may be an alkoxymethylated amino resin such as alkoxymethylated melamine resin and alkoxymethylated urea resin. Examples of alkoxymethylated melamine resin include methoxymethylated melamine resin, ethoxymethylated melamine resin, propoxymethylated melamine resin, and butoxymethylated melamine resin. Examples of the alkoxymethylated urea resin include methoxymethylated urea resin, ethoxymethylated urea resin, propoxymethylated urea resin, and butoxymethylated urea resin.

Two or more of the above-listed cross-linking agents may be employed.

The cross-linking agent is preferably about 0.01 to about 15 wt. % relative to the total solid content of the photosensitive resin composition such that an obtained film has increased transmittance of visible light and improved function as curable resin pattern.

The polymerizable monomer may be obtained by radical or cationic polymerization.

The polymerizable monomer may be a compound having a polymerizable carbon-to-carbon unsaturated bond that may be monofunctional, difunctional, or polyfunctional (i.e., trifunctional or more).

Examples of the monofunctional polymerizable monomer include nonylphenyl carbitol acrylate, nonylphenyl carbitol methacrylate, 2-hydroxy-3-phenoxypropyl acrylate, 2-hydroxy-3-phenoxypropyl methacrylate, 2-ethylhexyl carbitol acrylate, 2-ethylhexyl carbitol methacrylate, 2-hydroxyethyl acrylate, 2-hydroxyethyl methacrylate, and N-vinylpyrrolidone.

Examples of the difunctional polymerizable monomer include 1,6-hexanediol diacrylate, 1,6-hexanediol dimethacrylate, ethylene glycol diacrylate, ethylene glycol dimethacrylate, neopentyl glycol diacrylate, neopentyl glycol dimethacrylate, triethylene glycol diacrylate, triethylene glycol dimethacrylate, bis(acryloyloxyethyl ether of bisphenol A, 3-methylpentanediol diacrylate, and 3-methylpentanediol dimethacrylate.

Examples of the polyfunctional polymerizable monomer include trimethylolpropane triacrylate, trimethylolpropane trimethacrylate, pentaerythritol triacrylate, pentaerythritol trimethacrylate, pentaerythritol tetraacrylate, pentaerythritol tetramethacrylate, pentaerythritol pentaacrylate, pentaerythritol pentamethacrylate, di-pentaerythritol hexaacrylate, and di-pentaerythritol hexamethacrylate.

Preferably, the difunctional and polyfunctional polymerizable monomers can be used. In detail, pentaerythritol tetraacrylate and di-pentaerythritol hexaacrylate are preferable, and di-pentaerythritol hexaacrylate is more preferable. The difunctional and polyfunctional polymerizable monomers can be used in combination with monofunctional monomer.

The polymerizable monomer obtained by cationic polymerization may include a cationically polymerizable functional group such as a vinyl ether group, a propenyl ether group, an epoxy group, and an oxetanyl group.

Examples of the monomer including a vinyl ether group include triethylene glycol divinyl ether, 1,4-cyclohexane dimethanol divinyl ether, 4-hydroxy butyl vinyl ether, and dodecyl vinyl ether.

An example of the monomer including a propenyl ether group includes 4-(1-propenyloxymethyl)-1,3-dioxolane-2-on.

Examples of the monomer including an epoxy group include bisphenol A type epoxy resin, phenol novolac type epoxy resin, cresol novolac type epoxy resin, cycloaliphatic epoxy resin, glycidyl ester type epoxy resin, glycidyl amine type epoxy resin, and heterocyclic epoxy resin.

Examples of the monomer including an oxetanyl group include bis{3-(3-ethyloxetanyl)methyl}ether, 1,4-bis{3-(3-ethyloxetanyl)methoxy}benzene, 1,3-bis{3-(3-ethyloxetanyl)methoxy}benzene, 1,4-bis{3-(3-ethyloxetanyl)methoxymethyl}benzene, 1,3-bis{3-(3-ethyloxetanyl)methoxy}benzene, 1,4-bis{3-(3-ethyloxetanyl)methoxy}cyclohexane, 1,3-bis{3-(3-ethyloxetanyl)methoxy}cyclohexane, 1,4-bis{3-(3-ethyloxetanyl)methoxymethyl}cyclohexane, 1,3-bis{3-(3-ethyloxetanyl)methoxymethyl}cyclohexane, and 3-(3-ethyloxetanyl) methylated novolac resin.

Two or more of the above-listed polymerizable monomers can be used.

The polymerizable monomer is preferably about 0.001 to about 20 wt. %, and more preferably about 0.01 to about 10 wt. % relative to the total solid weight content of the photosensitive resin composition.

Examples of the silane coupling agent include methyl trimethoxy silane, methyl triethoxy silane, vinyl trichloro silane, vinyl trimethoxy silane, vinyl triethoxy silane, vinyl triacetoxy silane, vinyl tris(2-methoxyethoxy)silane, 3-chloropropyl-trimethoxy silane, 3-chloropropylmethyl-dichloro silane, 3-chloropropylmethyl-dimethoxy silane, 3-chloropropylmethyl-diethoxy silane, 3-glycidoxypropyl-trimethoxy silane, 3-glycidoxypropyl-triethoxy silane, 3-glycidoxypropylmethyl-dimethoxy silane, 3-mercaptopropyl-trimethoxy silane, 3-methacryloxypropyl-trimethoxy silane, 3-methacryloxypropylmethyl-dimethoxy silane, 2-(3,4-epoxycyclohexyl)ethyl-trimethoxy silane, N-2-(N-vinylbenzylaminoethyl)-3-aminopropyl-trimethoxy silane hydrochloride, hexamethyl disilazane, diaminosilane, triaminopropyltrimethoxysilane, 3-aminopropyl-trimethoxysilane, 3-aminopropyl-triethoxysilane, 3-aminopropylmethyl-diethoxysilane, 3-aminopropyl-tris(2-methoxyethoxysilane, 3-(2-aminoethyl)-3-aminopropyl-trimethoxysilane, 3-(2-aminoethyl)-3-aminopropylmethyl-trimethoxysilane, 3-ureidopropyl-trimethoxysilane, 3-ureidopropyl-triethoxysilane, N-aminoethyl-3-aminopropyl-trimethoxysilane, N-aminoethyl-3-aminopropylmethyl-trimethoxysilane, N-methyl-3-aminopropyl-trimethoxysilane, and N-phenyl-3-aminopropyl-trimethoxysilane, preferably include 3-glycidoxypropyl-trimethoxysilane, 3-glycidoxypropyl-triethoxy silane, 3-glycidoxypropyl-dimethoxysilane, and 3-glycidoxypropylmethyl-dimethoxysilane, which include an epoxy group, and more preferably, 2-(3,4-epoxycyclohexyl)ethyl-trimethoxy silane that includes an epoxy ring.

The silane coupling agent is preferably from about 0.01 to about 10 wt. %, more preferably from about 0.1 to about 2 wt. %, and most preferably from about 0.2 to about 1 wt. % relative to the total content of the photosensitive resin composition, such that a curable resin pattern made of the photosensitive resin composition shows improved adhesion with a substrate.

The photosensitive resin composition may further include other ingredients such as an antioxidant, a dissolution inhibitor, a sensitizer, an UV absorbent, a photostabilizer, an adhesion promoter, and an electron donor.

The photosensitive resin composition may be formed by mixing a solution containing an alkali-soluble resin dissolved in a solvent, another solution containing a quinone diazide in a solvent, and another solution containing a surfactant in a solvent. A solvent may be added to be mixed with the mixture. It is preferable to remove solids by filtering the mixture preferably by using a filter having a pore diameter less than about 3 microns and preferably from about 0.1 to about 2 microns. The alkali-soluble resin and the quinone diazide may be dissolved in the same solvent. A plurality of solvents that can be mixed with each other may be used.

Now, a method for forming a film pattern from the photosensitive resin composition is provided.

A photosensitive film is coated on a substrate such as transparent glass, exposed to light through a mask, and developed. One or more thin film patterns such as thin film transistors, color filters, organic light emitting diodes, etc., may be formed on the substrate before the photosensitive thin film is coated.

Examples of the coating of the photosensitive film include slit coating using a coating device having slit-type nozzles, slit-and-spin coating where the photosensitive resin composition flows through a slit on the substrate while the substrate is rotated, die coating, and curtain-flow coating. Of these coating methods, the slit-and-spin coating is preferred. After the coating, the photosensitive resin composition may be prebaked to remove volatile ingredients such as solvents, thereby forming the photosensitive resin film containing substantially no volatile ingredient. The photosensitive resin film may have a thickness from about 1.0 microns to about 8.0 microns.

Next, the photosensitive film is subjected to a first exposure through a mask. The mask has a pattern suitable for the function of the hardened resin pattern. The light exposure generates light such as g line or g line vertically over an entire surface of the photosensitive resin film, and aligns the mask with the photosensitive resin film using a mask aligner or a stepper.

The photoresist resin film is then developed by puddle development, immersion development, or spray development.

The development may be performed by using an alkaline aqueous solution. The alkaline aqueous solution contains an inorganic alkaline compound or an organic alkaline compound.

Examples of the inorganic alkaline compound include sodium hydroxide, potassium hydroxide, disodium hydrogen phosphate, sodium dihydrogen phosphate, diammonium hydrogen phosphate, ammonium dihydrogen phosphate, potassium dihydrogen phosphate, sodium silicate, potassium silicate, sodium carbonate, potassium carbonate, sodium hydrogen carbonate, potassium hydrogen carbonate, sodium borate, potassium borate, and ammonium.

Examples of the organic alkaline compound include tetramethylammonium hydroxide, 2-hydroxyethyltrimethylammonium hydroxide, monomethylamine, dimethylamine, trimethylamine, monoethylamine, diethylamine, triethylamine, monoisopropylamine, diisopropylamine, and ethanolamine.

Two or more of the above-listed alkaline compounds may be used. The content of the alkaline compound is from about 0.01 to about 10 wt. %, and preferably from about 0.1 to about 5 wt. % of the total content of the developer.

The developer may contain a surfactant such as a nonionic surfactant, a cationic surfactant, and an anionic surfactant.

Examples of the nonionic surfactant include polyoxyethylene derivatives such as polyoxyethylenealkylether, polyoxyethyleneallylether, and polyoxyethylenealkylallylether, oxyethylene/oxypropylene block copolymer, sorbitan fatty acid ester, polyoxyethylene sorbitan fatty acid ester, polyoxyethylene sorbitol fatty acid ester, glycerin fatty acid ester, polyoxyethylene fatty acid ester, and polyoxyethylene alkyl amine.

Examples of the cationic surfactant include an aminium salt such as stearylamine hydrochloride and a quaternary ammonium salt such as lauryl trimethyl ammonium chloride.

Examples of the anionic surfactant include: sulfate esters of higher alcohols, such as sodium lauryl alcohol sulfate ester and sodium oleinalcohol sulfate ester; alkyl sulfates such as sodium lauryl sulfate and ammonium lauryl sulfate; and alkyl allyl sulfonates such as sodium dodecylbenzene sulfonate and sodium dodecyl naphthalene sulfonate.

Two or more of the above-listed surfactants are used.

The developer may include an organic solvent including water soluble solvents such as methanol and ethanol.

The developer dissolves exposed portions of the photosensitive resin film, which are exposed to light, and leaves unexposed portions of the photosensitive resin film to form a film pattern.

Since the photosensitive resin composition includes the quinone diazide, the exposed portions of the photosensitive resin film is quickly removed in a short time, while the unexposed portions thereof is hardly removed even though they are in contact with the developer for a long time.

After the development, the substrate with the film pattern is cleaned with deionized water and dried.

A portion or an entire portion of the film pattern is then subjected to a second light exposure preferably using (deep) ultraviolet (V) ray. The illumination of UV on unit area in the second light exposure may be higher than that in the first light exposure. The second light exposure removes the portions that may be insufficiently exposed to light in the first light exposure to reduce the remnants.

The photosensitive resin pattern is postbaked at from about 150° C. to about 250° C., and more preferably from about 180° C. to about 240° C. for from about 5 to about 120 minutes, and more preferably from about 15 to about 90 minutes. The postbaking is performed by heating the substrate with a hot plate, a clean oven, etc. The postbaking improves the heat resistance and the solvent resistance of the cured photosensitive resin pattern.

Embodiments 1

Synthesis Example 1

Alkali-soluble Resin Synthesis

Following materials were put into a 200 ml flask provided with an agitator, a cooled tube, and a thermometer:

| | |
|---|---|
| methacrylate | 6.8 g; |
| N-cyclohexyl maleimide | 14.2 g; |
| 3-ethyl-3-methacryloxymethyloxetane | 17.8 g; |
| ethyl 3-ethoxypropionate | 45.3 g; |
| diethylene glycol methyl ethyl ether | 45.3 g; and |
| azobisisobutyronitrile | 1.1 g |

The flask was then immersed in an oil bath and agitated for about three hours under nitrogen ($N_2$) atmosphere while maintaining the temperature of the interior of the flask at about 100-110° C. As a result, an alkali-soluble resin A1 was obtained, which had an average molecular weight (Mw) of about 8,000 based on polystyrene standards.

The measurement of the average molecular weight was performed by GPC under the following conditions:

Device: HLC-8120GPC (manufactured by TOSOH Corporation in Japan)

Columns: TSK-GELG4000HXL+TSK-GELG2000HXL (serial connection) (manufactured by TOSOH Corporation in Japan)

Column Temperature: 40° C.

Solvent: tetrahydrofuran (THF)

Flow Rate: 1.0 ml/min

Injected Amount: 50 μl

Detector: RI (Refractive Index)

Concentration of Sample: 0.6 wt. %

Standard: TSK STANDARD POLYSTYRENE F-40, F-4, F-1, A-2500, A-500

SYNTHESIS EXAMPLE 2

Silicone Compound Synthesis 204 g of polyoxyethylene having a molecular chain that has an allyl group at a terminal end and an OH group at another terminal end as shown in Chemical Formula 4 was uniformly mixed with 300 g isopropyl alcohol, 0.5 g isopropyl alcohol containing 2% chloroplatinic acid, and 1 g potassium acetate in a flask. The temperature was then increased up to a reflux temperature (i.e., 83° C.) of isopropyl alcohol, and 111 g methyl siloxane having Chemical Formula 5 was gradually added, e.g. with a dropper, to start a reaction.

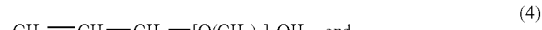

$$CH_2\!\!=\!\!CH\!-\!CH_2\!-\![O(CH_2)_2]_8OH, \text{ and} \qquad (4)$$

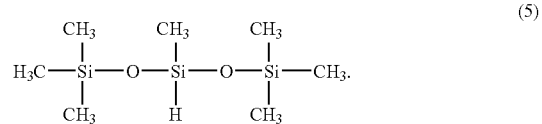

(5)

After the addition of methyl siloxane, the reaction was maintained for four hours and terminated after the formation of SiH group was confirmed. Thereafter, the product was heated for two hours at 110° C. and 10 mmHg to remove isopropyl alcohol. 310 g of a compound having Chemical Formula 6 was formed.

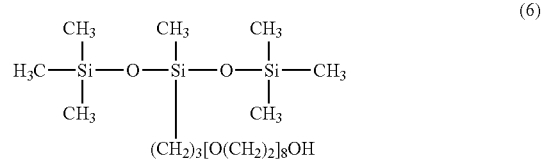

(6)

EXAMPLE 1

Preparation of Photosensitive Resin Composition 1

100 parts by weight of alkali-soluble resin A1, 22 parts by weight of quinone diazide having Chemical Formula 7, two parts by weight of (p-tolyl)(p-isopropylphenyl)iodonium tetrakis(pentafluorophenyl)borate as a cationic polymerization initiator, a surfactant including 0.08 parts by weight of 3-perfluorooctyl-1,2-epoxypropane as a fluorosurfactant, 0.08 parts by weight of a first silicone compound having Chemical Formula 6, and 0.15 parts by weight of SH8400 (manufactured by Dow Corning Toray Silicone Co., Ltd.) as a second silicone compound, and a solvent including 291 parts by weight of ethyl 3-ethoxy propionate, 291 parts by weight of diethylene glycol methylethyl ether, 32 parts by weight of butyl acetate, and 32 parts by weight of butyl lactate are mixed at 23° C., and they were filtrated under pressure through a polytetrafluoroethylene cartridge filter having a pore diameter of 1.0 micron to obtain a photosensitive resin composition 1.

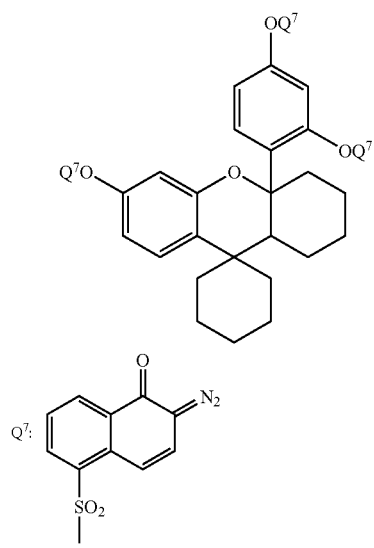

(7)

COMPARATIVE EXAMPLE 1

Preparation of Photosensitive Resin Composition 2

Except for a solvent including 557 parts by weight of ethyl-s-lactate and 62 parts by weight of butyl acetate, the conditions and the materials were the same as those of Example 1 to obtain a photosensitive resin composition 2.

COMPARATIVE EXAMPLE 2

Preparation of Photosensitive Resin Composition 3

Except for a solvent including 557 parts by weight of diethylene glycol methylethyl ether and 62 parts by weight of butyl acetate, the conditions and the materials were the same as those of Example 1 to obtain a photosensitive resin composition 3.

COMPARATIVE EXAMPLE 3

Preparation of Photosensitive Resin Composition 4

Except for a solvent including 251 parts by weight of ethyl 3-ethoxy propionate, 314 parts by weight of diethylene glycol methylethyl ether, and 63 parts by weight of butyl acetate, the conditions and the materials were the same as those of Example 1 to obtain a photosensitive resin composition 4.

COMPARATIVE EXAMPLE 4

Preparation of Photosensitive Resin Composition 5

Except for a solvent including 35 parts by weight of butyl lactate, 314 parts by weight of ethyl 3-ethoxy propionate, and 349 parts by weight of diethylene glycol methylethyl ether, the conditions and the materials were the same as those of Example 1 to obtain a photosensitive resin composition 5.

COMPARATIVE EXAMPLE 5

Preparation of Photosensitive Resin Composition 4

Except for a solvent including 588 parts by weight of diethylene glycol methylethyl ether and 31 parts by weight of butyl acetate, the conditions and the materials were the same as those of Example 1 to obtain a photosensitive resin composition 6.

Estimation of Stain Generation and Coating Uniformity

The photosensitive resin composition 1 (Example 1), the photosensitive resin composition 2 (Comparative Example 1), the photosensitive resin composition 3 (Comparative Example 2), the photosensitive resin composition 4 (Comparative Example 3), the photosensitive resin composition 5 (Comparative Example 4), and the photosensitive resin composition 6 (Comparative Example 5) were coated on six separate glass substrates coated with Mo films by using a spin-and-slit coater manufactured by Dainippon Screen Manufacturing Co. Ltd. Thereafter, the solvents were removed by prebaking the resin compositions in a hot plate for 135 seconds at 100° C.

Next, the substrates were subjected to a first light exposure using an exposer (MPA-2000 manufactured by Canon Inc. in Japan) and to development by puddle development. The substrates were then rinsed by pure water and dried, and entire surfaces of the substrates were exposed to light during a second light exposure. Subsequently, the resin compositions were postbaked in a hot plate for 160 seconds at 130° C. to form a transparent cured resin pattern.

Observations on stains on the transparent cured resin and build-up phenomenons at edges of the substrates gave the results illustrated in TABLE 1 and FIGS. 11A-11E.

Here, it is noted that Example 1 (EX 1) was formed by using a solvent of the invention, Comparative Example 1 (CE 1) was formed by using a conventional solvent, and Comparative Examples 2-5 (CE 1-5) were made by using solvents without one or more ingredients of the solvent of the invention.

FIGS. 11A, 11B, 11C, 11D and 11E are photographs of the photosensitive resin films for Comparative Example 1, Comparative Example 2, Comparative Example 3, Comparative Example 4, Comparative Example 5, and Example 1, respectively.

TABLE 1

| | Horizontal Stripe Stain | Vertical Stripe Stain | Irregular Spot | Thickness Variation at Edge of Substrate |
|---|---|---|---|---|
| CE 1 | X | Δ | ◯ | Δ |
| CE 2 | Δ | Δ | Δ | Δ |
| CE 3 | X–Δ | Δ | Δ | Δ |
| CE 4 | X | ◯ | Δ | Δ |
| CE 5 | X | X | Δ | X |
| Ex 1 | □ | □ | ◯ | ◯ |

(□: excellent, ◯: good, Δ: normal, X: poor)

In Comparative Example 1, the primary ingredient, ethyl-s-lactate of the solvent, has a relatively low boiling point of about 150° C. and thus the resin composition is partly dried near the nozzle before it reaches the substrate. Accordingly, the injection property is poor and both horizontal and vertical stripe stains were generated.

The solvent in Example 1 includes ingredients having relatively high boiling points, such as diethylene glycol dialkyl ether (having a boiling point equal to about 177° C.), ethyl 3-ethoxy propionate (having a boiling point equal to about 170° C.), and butyl lactate having a boiling point equal to about 188° C. These solvents also have a good dissolution property with solid ingredients and a good coating characteristic. These ingredients adjust the volatilization of the solvent during the drying stage to reduce the generation of stains caused by poor drying of the solvent. In addition, these ingredients have a good solubility for solid ingredients as compared with the conventional solvent ingredients to reduce the build-up phenomenon near the edges of the film. Accordingly, the transmissive and the reflective characteristics are improved.

Although butyl acetate in the solvent has a relatively low boiling point, it adjusts the injection pressure to improve the flatness of the photosensitive resin film.

The weight fraction of butyl acetate is preferably from about 1 wt. % to about 20 wt. %. When the butyl acetate weight fraction is less than about 1 wt. %, the injection pressure may be nonuniform and cause unevenness of the film. When the weight fraction is more than about 20 wt. %, the low boiling point of the butyl acetate increases the drying speed to cause partial stains, and injection fluidity is increased to cause poor coating property.

The dissolution characteristic and the coating characteristic when the weight fractions were not in the above-described range are shown in TABLE 2. Although there is no stains over the entire surface unlike Comparative Examples 1-5, partial stains were generated and coating characteristic and film adhesiveness were degraded.

TABLE 2

| wt % | BLC | EEP | EDM | nBA | Partial Spot | Thickness of Substrate Edge | Coating Uniformity | Film Adhesiveness |
|---|---|---|---|---|---|---|---|---|
| CE 6 | 25 | 35 | 30 | 10 | □ | X | ○ | ○ |
| CE 7 | 5 | 80 | 10 | 5 | Δ (irregular spots) | □ | ○ | □ |
| CE 8 | 10 | 5 | 68 | 13 | Δ (horizontal/vertical) | ○ | □ | Δ |
| CE 9 | 8 | 35 | 35 | 22 | X (horizontal/vertical) | □ | ○ | ○ |
| CE 10 | 5 | 13 | 77 | 5 | Δ (irregular spots) | □ | Δ | ○ |
| CE 11 | 18 | 65 | 7 | 15 | Δ (horizontal/vertical) | Δ | □ | Δ |

BLC: butyl lactate
EEP: ethyl 3-ethoxy propionate
EDM: diethylene glycol methyl ethyl ether
nBA: butyl acetate
(□: excellent, ○: good, Δ: normal, X: poor)

Furthermore, optimal proportions of the ingredients can remove even partial stains caused by the nonuniformity of the dissolution and can provide an optimal injection condition.

As describe above, the weight fraction of each of diethylene glycol methylethyl ether and ethyl 3-ethoxy propionate is preferably about 10 wt. % to about 70 wt. %. When the weight fraction of each of these compounds is less than about 10 wt. %, the resulting composition dries too fast and it becomes difficult to maintain appropriate injection. The adhesion with the substrate may also become poor. On the other hand, if the weight fraction of each of these compounds is more than about 70 wt. %, the resulting composition dries too slow such that irregular stains are partly generated and the solubility for solids are decreased to yield nonuniform resin. It is noted that the nonuniformity of the dissolved solid ingredients may be recognized as stains regardless of the drying speed.

The weight fraction of butyl lactate is preferably from about 1 wt. % to about 20 wt. %. When the butyl lactate makes up equal to or more than 1 wt. % of the composition, it improves the coating uniformity. However, using more than 20 wt. % butyl lactate may reduce the fluidity of the composition and cause partial build-up near the edges of the substrate.

Embodiment 2

Now, thin film transistor (TFT) array panels for liquid crystal display (LCD) including an insulating layer made from the above-described photosensitive resin composition 1 and manufacturing methods thereof are described in detail with reference to accompanying drawings.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present.

First, a thin film transistor (TFT) array panel according to an embodiment of the present invention will be described in detail with reference to FIGS. 1 and 2.

Figure 2:
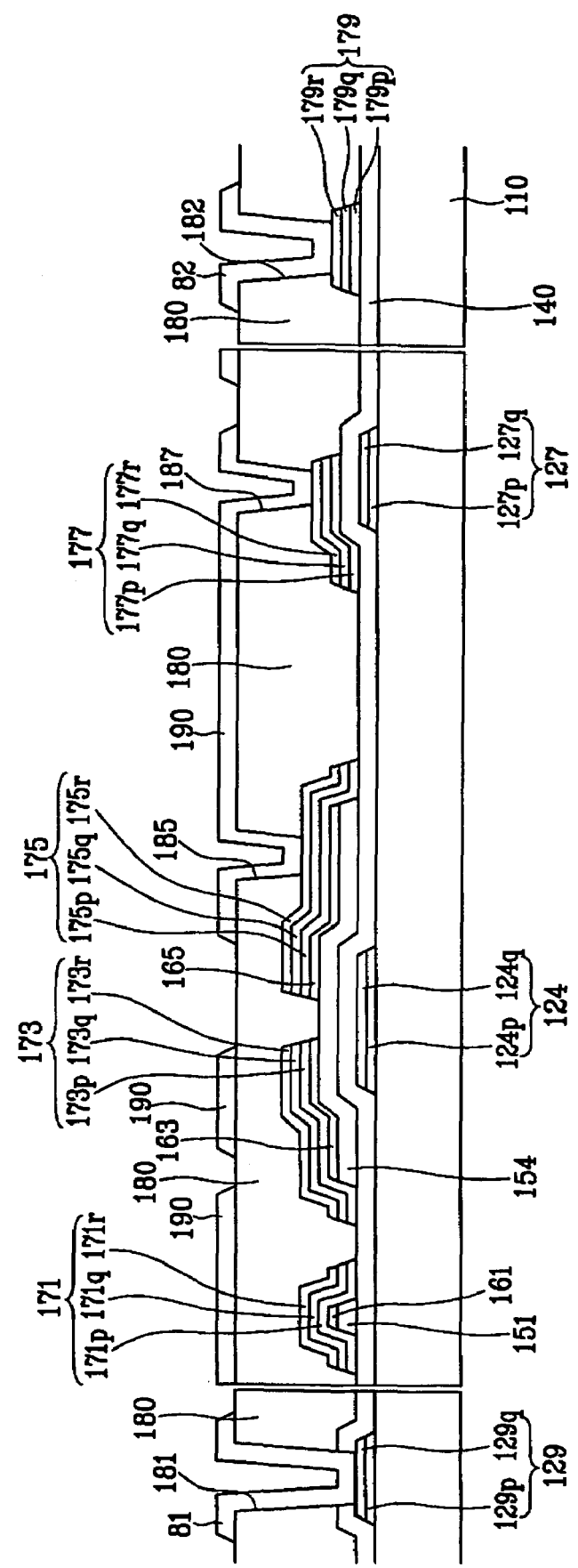
FIG. 2 is a sectional view of the TFT array panel shown in FIG. 1 taken along the line II-II'.

FIG. 1 is a layout view of a TFT array panel according to an embodiment of the present invention and FIG. 2 is a sectional view of the TFT array panel shown in FIG. 1 taken along the line II-II'.

A plurality of gate lines 121 are formed on an insulating substrate 110, which may be transparent glass or plastic, among others.

The gate lines 121 transmit gate signals and extend substantially in a first direction. Each gate line 121 includes a plurality of gate electrodes 124, a plurality of projections 127 projecting downward, and an end portion 129 having a large area for contact with another layer or an external driving circuit. A gate driving circuit (not shown) for generating the gate signals may be mounted on a flexible printed circuit (FPC) film (not shown), which may be attached to the substrate 110, directly mounted on the substrate 110, or integrated onto the substrate 110. The gate lines 121 may extend to be connected to a driving circuit that may be integrated on the substrate 110.

The gate lines 121 include two conductive films that have different physical characteristics: a lower film and an upper film disposed on the lower film. The lower film is preferably made of a low-resistivity metal including an Al-containing metal such as Al and Al alloy, Ag-containing metal such as Ag and Ag alloy, and Cu-containing metal such as Cu and Cu alloy, for reducing signal delay or voltage drop. The upper film is preferably made of a material such as Mo containing metal such as Mo and Mo alloy, Cr, Ta, or Ti, which has good physical, chemical, and electrical contact characteristics with other materials such as indium tin oxide (ITO) or indium zinc oxide (IZO). A good example of the combination of the two films is a lower Al (alloy) film and an upper Mo (alloy) film.

However, the lower film may be made of good contact material, and the upper film may be made of low resistivity material. In this case, the upper film 129$q$ of the end portions 129 of the gate lines 121 may be removed to expose the lower film 129$p$. In addition, the gate lines 121 may include a single layer preferably made of the above-described materials. Otherwise, the gate lines 121 may be made of various metals or conductors.

In FIGS. 2A and 2B, for the gate electrodes 124 and the projections 127, the lower and upper films thereof are denoted by additional characters p and q, respectively.

The lateral sides of the gate lines 121 are inclined relative to a surface of the substrate 110, and the inclination angle thereof ranges between about 30-80 degrees. A gate insulating layer 140 preferably made of silicon nitride (SiNx) or silicon oxide (SiOx) is formed on the gate lines 121.

A plurality of semiconductor stripes 151 preferably made of hydrogenated amorphous silicon (abbreviated to "a-Si") or polysilicon are formed on the gate insulating layer 140. Each semiconductor stripe 151 extends substantially in the second direction and becomes wide near the gate lines 121 such that the semiconductor stripes 151 cover large areas of the gate lines 121. The second direction is substantially perpendicular to the first direction. Each semiconductor stripe 151 has a plurality of projections 154 branching out toward the gate electrodes 124.

A plurality of ohmic contact stripes and islands 161 and 165 are formed on the semiconductor stripes 151. The ohmic contact stripes and islands 161 and 165 are preferably made of n+ hydrogenated a-Si heavily doped with an n-type impurity such as phosphorus or they may be made of silicide. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate, and the inclination angles thereof are preferably in a range of about 30-80 degrees.

A plurality of data lines 171, a plurality of drain electrodes 175, and a plurality of storage conductors 177 are formed on the ohmic contacts 161 and 165 and the gate insulating layer 140.

The data lines 171 transmit data signals and extend substantially in the second direction to intersect the gate lines 121. Each data line 171 includes a plurality of source electrodes 173 projecting toward the gate electrodes 124 and an end portion 179 having a large area for contact with another layer or an external driving circuit. A data driving circuit (not shown) for generating the data signals may be mounted on a FPC film (not shown), which may be attached to the substrate 110, directly mounted on the substrate 110, or integrated onto the substrate 110. The data lines 171 may extend to be connected to a driving circuit that may be integrated on the substrate 110.

The drain electrodes 175 are separated from the data lines 171 and disposed opposite the source electrodes 173 with respect to the gate electrodes 124.

A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The storage conductors 177 are disposed on the projections 127 of the gate lines 121.

The data lines 171, the drain electrodes 175, and the storage conductors 177 have a triple-layered structure including a lower film 171$p$, 175$p$ and 177$p$, an intermediate film 171$q$, 175$q$ and 177$q$, and an upper film 171$r$, 175$r$ and 177$r$. The lower film 171$p$, 175$p$ and 177$p$ is preferably made of refractory metal such as Cr, Mo, Ta, Ti, or alloys thereof, the intermediate film 171$q$, 175$q$ and 177$q$ is preferably made of low resistivity metal such as Al containing metal, Ag containing metal, and Cu containing metal, and the upper film 171$r$, 175$r$ and 177$r$ is made of refractory metal or alloys thereof having a good contact characteristic with ITO or IZO.

The data lines 171, the drain electrodes 175, and the storage conductors 177 may have a double-layered structure including a refractory-metal lower film (not shown) and a low-resistivity upper film (not shown) or a single-layer structure preferably made of the above-described materials. However, the data lines 171, the drain electrodes 175, and the storage conductors 177 may be made of various metals or conductors.

In FIGS. 2A and 2B, for the source electrodes 173 and the end portions 179 of the data lines 179, the lower, the intermediate, and the upper films thereof are denoted by additional characters p, q and r, respectively.

The data lines 171, the drain electrodes 175, and the storage conductors 177 have inclined edge profiles, and the inclination angles thereof range about 30-80 degrees.

The ohmic contacts 161 and 165 are interposed only between the underlying semiconductor stripes 151 and the overlying conductors 171 and 175 thereon and reduce the contact resistance therebetween. Although the semiconductor stripes 151 are narrower than the data lines 171 in most places, the width of the semiconductor stripes 151 becomes large near the gate lines 121 as described above, to smooth the profile of the surface, thereby preventing the disconnection of the data lines 171. The projections 154 of the semiconductor stripes 151 include some exposed portions that are not covered by the data lines 171, the drain electrodes 175, and the storage conductors 177 such as portions located between the source electrodes 173 and the drain electrodes 175.

A passivation layer 180 is formed on the data lines 171, the drain electrodes 175, the storage conductors 177, and the exposed portions of the semiconductor stripes 151.

The passivation layer 180 is preferably made of photosensitive organic insulator having a dielectric constant that is preferably less than about 4.0. The passivation 180 may have a flat surface and a thickness from about 1.0 to about 8.0 microns.

The organic insulator for the passivation 180 is a photosensitive resin composition including an alkali-soluble resin, a quinone diazide, surfactants, and a solvent. The solvent includes a diethylene glycol dialkyl ether that includes an alkyl group including one to five carbon atoms, an ethyl 3-ethoxy propionate, an alkyl acetate that includes an alkyl group including three to eight carbon atoms, and an alkyl lactate that includes an alkyl group including one to six carbon atoms.

The solvent in the photosensitive resin composition has an improved solubility for solid ingredients such as the alkali-soluble resin and the quinone diazide to aid a uniform deposition of the photosensitive resin composition. Among the solvent ingredients, diethylene glycol dialkyl ether, ethyl 3-ethoxy propionate, and butyl lactate properly adjust the drying speed with their high boiling points to prevent the drying of a front-end of an injection nozzle. The same solvent ingredients also improve the solubility for the solid ingredients. In addition, butyl acetate in the solvent improves the flatness of the resin composition. Accordingly, the photosensitive resin composition regulates the volatilization rate of the solvent to reduce stains caused by inferior dry of the solvent and improves the solubility for the solid ingredients, thereby forming a uniformly thick film. As a result, the build-up at the edges of the passivation layer 180 is remarkably reduced to improve the transmissive and the reflective characteristics of the passivation layer 180.

The passivation layer 180 may include a lower film of inorganic insulator such as silicon nitride or silicon oxide and an upper film of the above-described organic insulator such that it takes the excellent insulating characteristics of the organic insulator while preventing the exposed portions of the semiconductor stripes 151 from being damaged by the organic insulator.

The passivation layer 180 has a plurality of contact holes 182, 185 and 187 exposing the end portions 179 of the data lines 171, the drain electrodes 175, and the storage conductors 177, respectively. The passivation layer 180 and the gate insulating layer 140 have a plurality of contact holes 181 exposing the end portions 129 of the gate lines 121.

A plurality of pixel electrodes 190 and a plurality of contact assistants 81 and 82 are formed on the passivation layer 180. They are preferably made of transparent conductor such as ITO or IZO or reflective conductor such as Ag, Al, Cr, or alloys thereof.

The pixel electrodes 190 are physically and electrically connected to the drain electrodes 175 through the contact holes 185 and connected to the storage conductors 177 through the contact holes 177 such that the pixel electrodes 190 receive data voltages from the drain electrodes 175 and transmit the data voltages to the storage conductors 177. The pixel electrodes 190 supplied with the data voltages generate electric fields in cooperation with a common electrode (not shown) of an opposing display panel (not shown) that is supplied with a common voltage. The generated electric fields determine the orientations of liquid crystal molecules (not shown) of a liquid crystal layer (not shown) disposed between the two electrodes. A pixel electrode 190 and the common electrode form a capacitor referred to as a "liquid crystal capacitor," which stores applied voltages after the TFT turns off.

A pixel electrode 190 overlaps a projection 127 of a previous gate line 121. The pixel electrode 190 and a storage conductor 177 connected thereto and the projection 127 form an additional capacitor referred to as a "storage capacitor," which enhances the voltage-storing capacity of the liquid crystal capacitor.

The pixel electrodes 190 overlap the gate lines 121 and the data lines 171 to increase the aperture ratio.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and enhance the adhesion between the end portions 129 and 179 and external devices.

A plurality of slope members (not shown) may be formed on the pixel electrodes 190 and the passivation layer 180. Each of the slop members includes a ridge and inclined surfaces having an inclination angle of from about 1 to about 10 degrees and determines tilt directions of the liquid crystal molecules to reduce the response time of the liquid crystal. Like the passivation layer 180, the slope members may be made of a photosensitive resin composition including an alkali-soluble resin, a quinone diazide, surfactants, and a solvent. The solvent includes a diethylene glycol dialkyl ether that includes an alkyl group including one to five carbon atoms, an ethyl 3-ethoxy propionate, an alkyl acetate that includes an alkyl group including three to eight carbon atoms, and an alkyl lactate that includes an alkyl group including one to six carbon atoms.

A method for manufacturing the TFT array panel shown in FIGS. 1 and 2 according to an embodiment of the present invention will be described with reference to FIGS. 3A-6B as well as FIGS. 1 and 2.

Figure 3A:
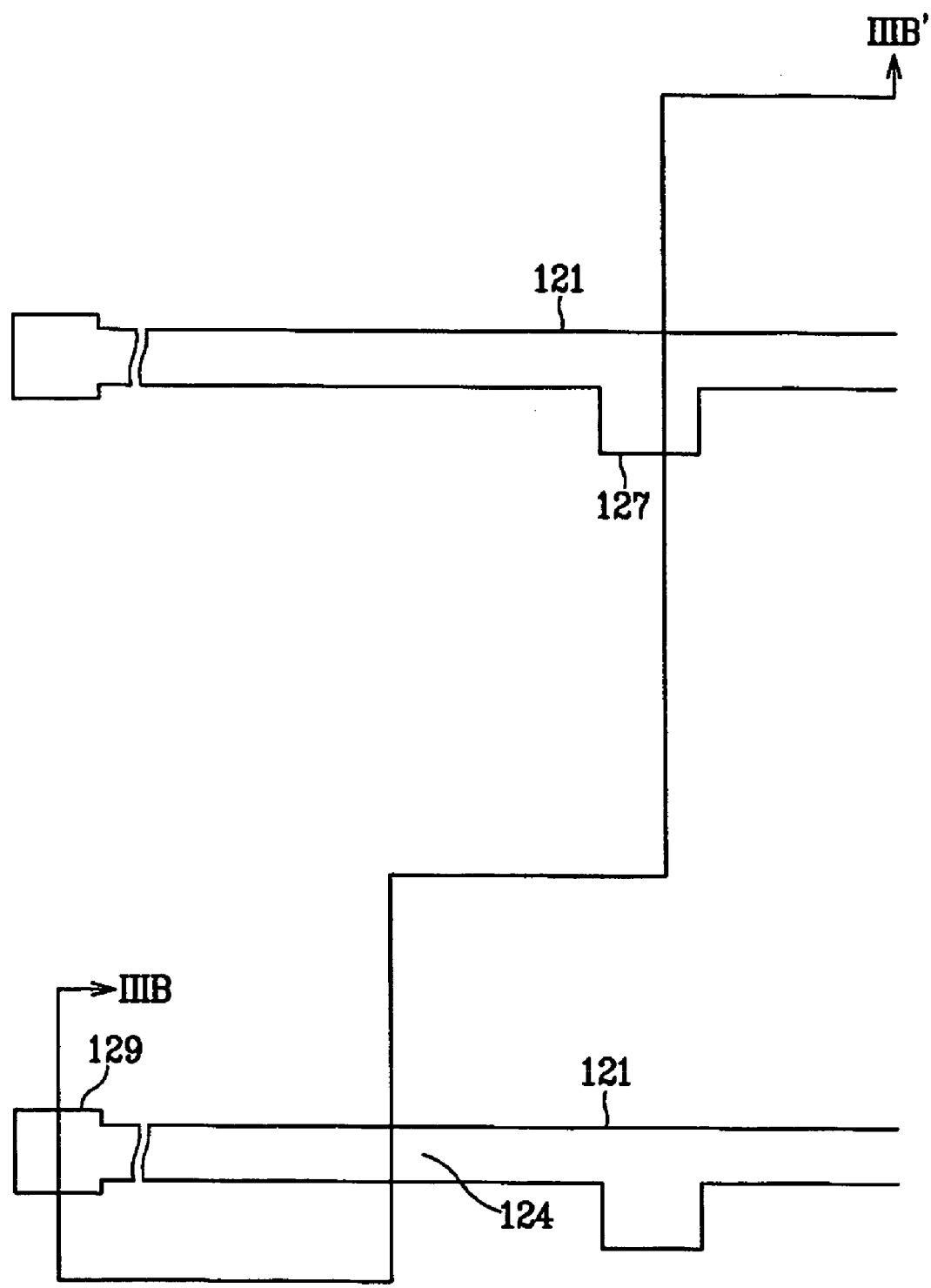
FIGS. 3A, 4A, 5A and 6A are layout views of the TFT array panel shown FIGS. 1 and 2 in intermediate steps of a manufacturing method thereof according to an embodiment of the present invention.
Figure 3B:
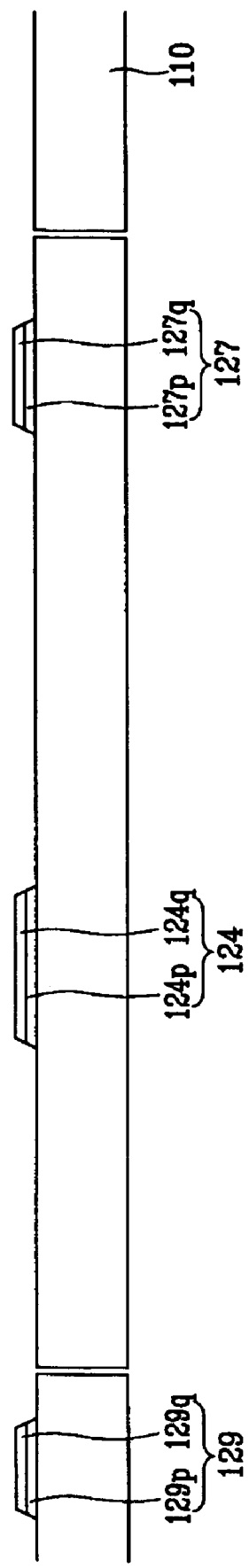
FIG. 3B is a sectional view of the TFT array panel shown in FIG. 3A taken along the line IIIB-IIIB'.
Figure 4A:
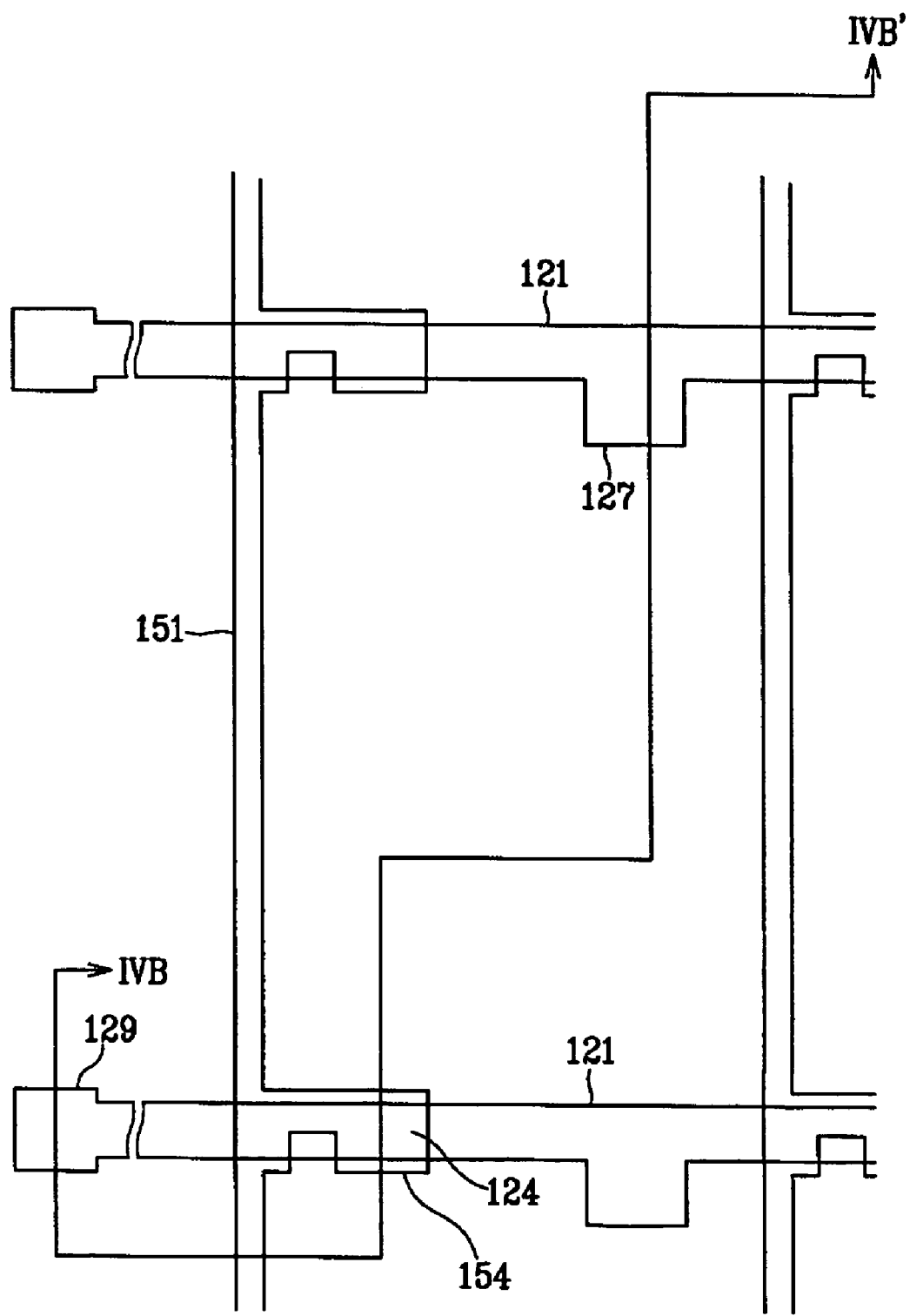
Figure 4B:
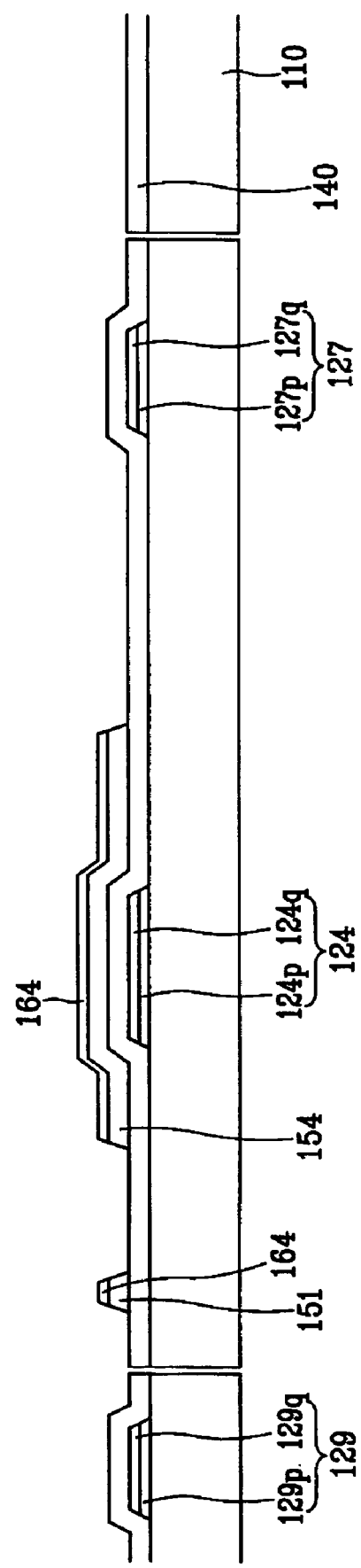
FIG. 4B is a sectional view of the TFT array panel shown in FIG. 4A taken along the line IVB-IVB'.
Figure 5A:
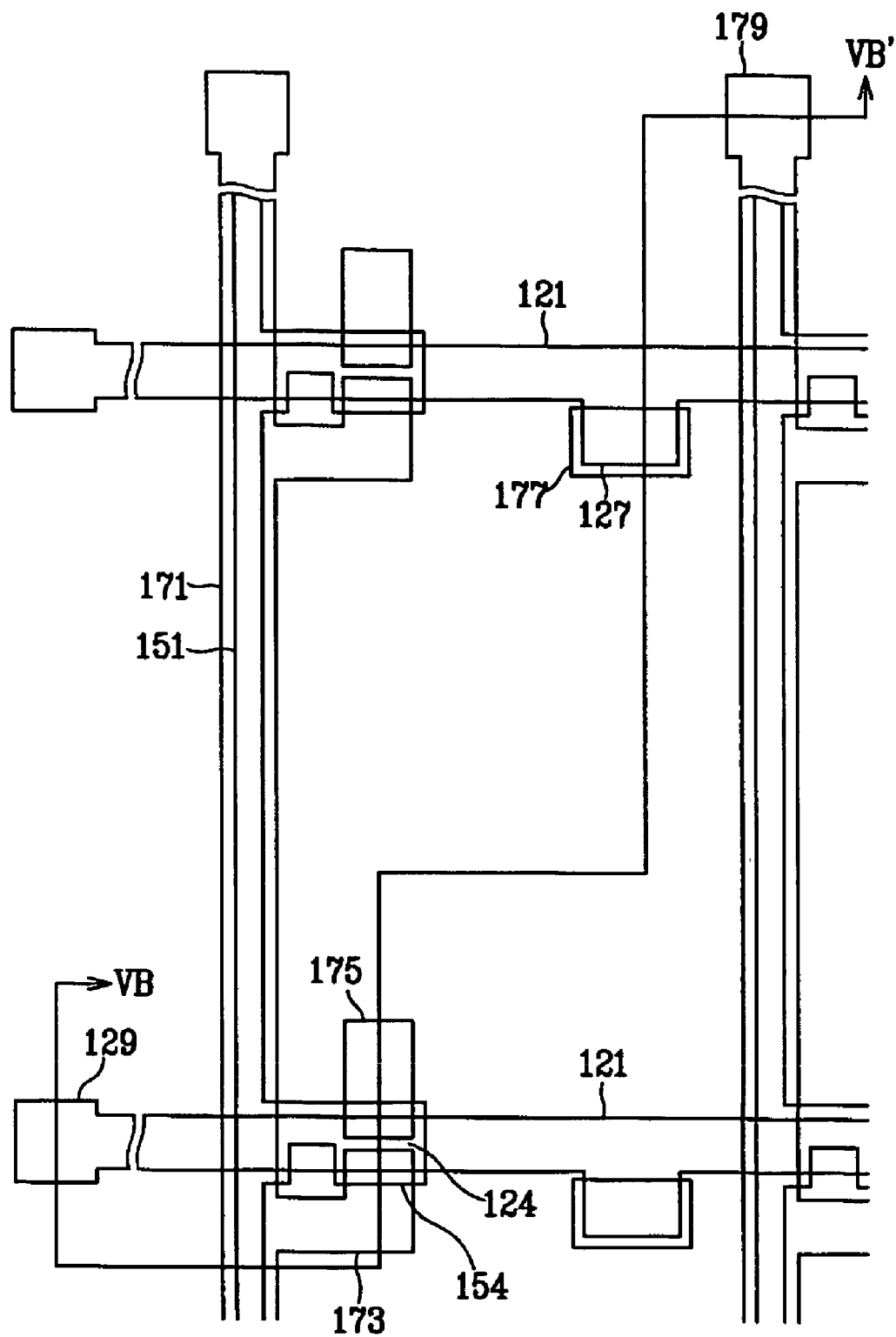
Figure 5B:
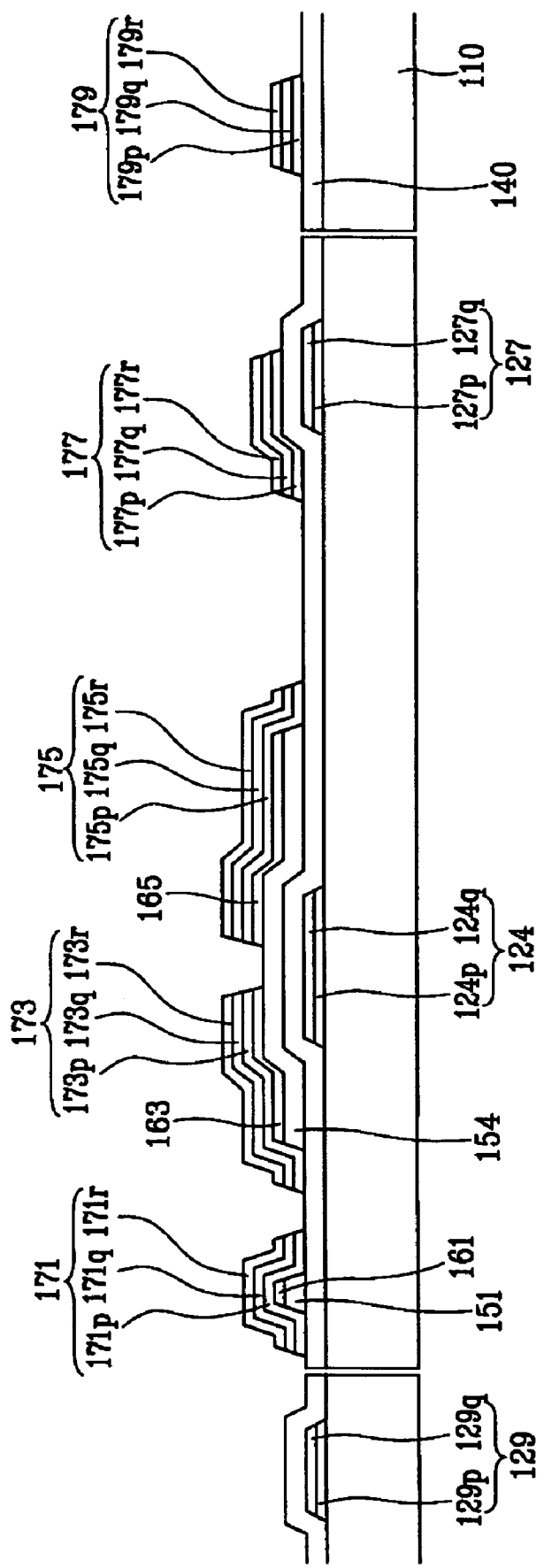
FIG. 5B is a sectional view of the TFT array panel shown in FIG. 5A taken along the line VB-VB'.
Figure 6A:
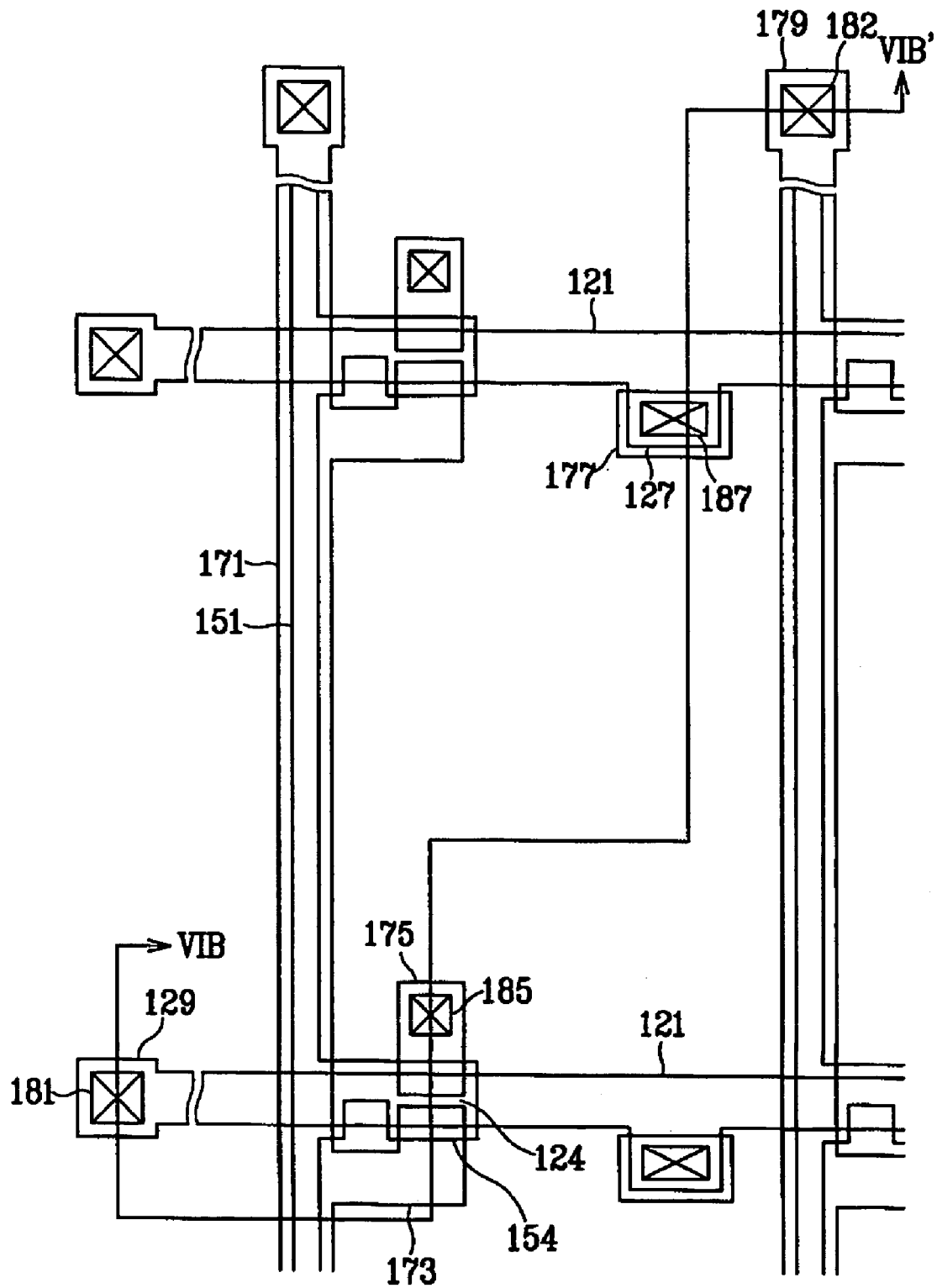
Figure 6B:
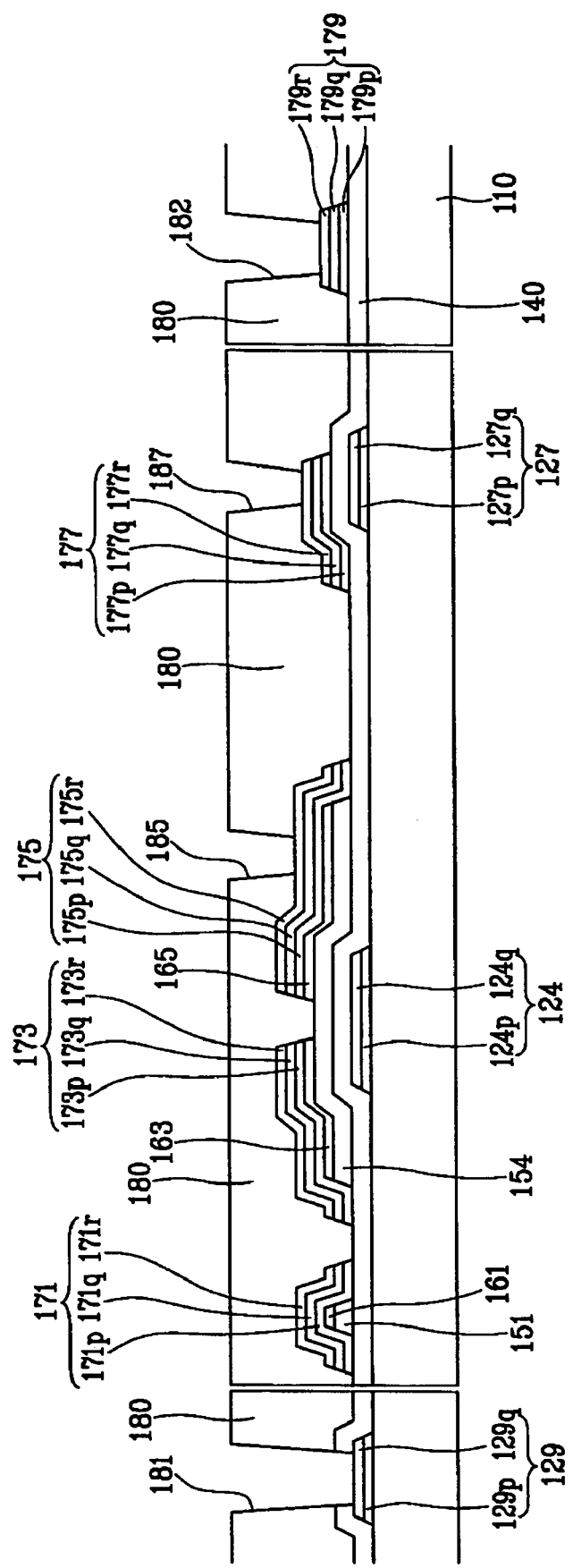
FIG. 6B is a sectional view of the TFT array panel shown in FIG. 6A taken along the line VIB-VIB'.

FIGS. 3A, 4A, 5A and 6A are layout views of the TFT array panel shown FIGS. 1 and 2 in intermediate steps of a manufacturing method thereof according to an embodiment of the present invention, FIG. 3B is a sectional view of the TFT array panel shown in FIG. 3A taken along the line IIIB-IIIB', FIG. 4B is a sectional view of the TFT array panel shown in FIG. 4A taken along the line IVB-IVB', FIG. 5B is a sectional view of the TFT array panel shown in FIG. 5A taken along the line VB-VB', and FIG. 6B is a sectional view of the TFT array panel shown in FIG. 6A taken along the line VIB-VIB'.

Referring to FIGS. 3A and 3B, a conductive layer is deposited on an insulating substrate 110 by sputtering, etc. The conductive layer has a lower film preferably made of Al or Al-Nd alloy and having a thickness of preferably about 2,500 Å and an upper film preferably made of Mo.

The lower and the upper films may be co-sputtered using an Al or Al—Nd target and a Mo target. When the lower film is deposited, the Al(—Nd) target is powered, while the Mo target is unpowered. After the deposition of the lower film, the Al(—Nd) target is unpowered and the Mo target is powered to deposit the upper film.

The upper and the lower films are patterned by lithography and etching to form a plurality of gate lines 121 including gate electrodes 124, projections 127, and end portions 129.

Referring to FIGS. 4A and 4B, a gate insulating layer 140 having a thickness of from about 2,000 to about 5,000 Å is deposited at a temperature of about 250 to about 500° C. Subsequently, an intrinsic amorphous silicon layer and an extrinsic amorphous silicon layer are sequentially deposited on the gate insulating layer 140 and patterned by lithography and etching to form a plurality of extrinsic semiconductor .

stripes 164 and a plurality of intrinsic semiconductor stripes 151 including projections 154.

Referring to FIGS. 5A and 5B, a conductive layer is deposited by sputtering, etc. The conductive layer includes a lower film preferably made of Mo, an intermediate film preferably made of Al, and an upper film preferably made of Mo. The thickness of the conductive layer is equal to about 4,000 Å and the sputtering temperature is equal to about 150° C.

The conductive layer is then patterned by lithography and wet etch to form a plurality of data lines 171 including source electrodes 173 and end portions 179, the drain electrodes 175, and the storage conductors 177. The etchant for the wet etch may include phosphoric acid of preferably about 63-70%, nitric acid of preferably about 4-8%, acetic acid of preferably about 8-11%, and deionized water.

Thereafter, exposed portions of the extrinsic semiconductor stripes 164, which are not covered with the data lines 171, the drain electrodes 175, and the storage conductors 177, are removed to complete a plurality of ohmic contact stripes 161 including projections 163 and a plurality of ohmic contact islands 165 and to expose portions of the intrinsic semiconductor stripes 151. Oxygen plasma treatment preferably follows in order to stabilize the exposed surfaces of the semiconductor stripes 151.

Referring to FIGS. 6A and 6B, a photosensitive resin film including an alkali-soluble resin, a quinone diazide, surfactants, and a solvent is coated. The solvent includes a diethylene glycol dialkyl ether that includes an alkyl group including one to five carbon atoms, an ethyl 3-ethoxy propionate, an alkyl acetate that includes an alkyl group including three to eight carbon atoms, and an alkyl lactate that includes an alkyl group including one to six carbon atoms.

The coating is performed by slit coating with moving the substrate 110 or a nozzle (not shown) of a coater (not shown) and the thickness of the coated resin composition is from about 1.0 to about 8.0 microns.

After the coating, the substrate 110 coated with the photosensitive resin composition is put into an oven and prebaked for about 90 to about 180 seconds at a temperature of about 90 to about 110° C. The prebaking removes volatile ingredients such as solvents.

Next, the photosensitive film is aligned with a mask by using a mask aligner and subjected to a first exposure through the mask. The light exposure generates light such as g line or g line vertically over an entire surface of the photosensitive resin film.

The photoresist resin film is then developed by puddle development with a developer of an alkaline aqueous solution preferably containing 3 wt. % diisopropyl amine. The developer dissolves exposed portions of the photosensitive resin film, which are exposed to light, and leaves unexposed portions of the photosensitive resin film to form a passivation layer 180 having a plurality of contact holes 182, 185 and 187 and upper portions of a plurality of contact holes 181 as shown in FIGS. 6A and 6B.

Since the photosensitive resin composition includes the quinone diazide, the exposed portions of the photosensitive resin film is quickly removed in a short time, while the unexposed portions are hardly removed even though they are in contact with the developer for a long time.

After the development, the substrate 110 with the passivation layer 180 is cleaned with deionized water and dried.

At least a portion of the passivation layer 180 is then subjected to a second light exposure preferably using (deep) ultraviolet (UV) ray. The illumination of UV on unit area in the second light exposure may be higher than that in the first light exposure. The second light exposure is conducted in order to lighten transparency of the passivation layer 180.

The passivation layer 180 is postbaked for about 130 to about 160 seconds in a hot plate (not shown) or for from about 20 to about 90 minutes in a clean oven at a temperature of about 150° C. to about 250° C. and more preferably about 180° C. to about 240° C. The postbaking improves the heat resistance and the solvent resistance of the cured photosensitive resin pattern.

The solvent in the photosensitive resin composition has an improved solubility for solid ingredients such as the alkali-soluble resin and the quinone diazide to make the photosensitive resin composition uniformly spread. Among the solvent ingredients, diethylene glycol dialkyl ether, ethyl 3-ethoxy propionate, and butyl lactate properly adjust the drying speed by their high boiling points to prevent the dry of a front end of an injection nozzle and they improves the solubility for the solid ingredients. In addition, butyl acetate in the solvent improves the flatness of the resin composition. Accordingly, the photosensitive resin composition regulates the volatilization rate of the solvent to reduce stains caused by inferior dry of the solvent and improves the solubility for the solid ingredients, thereby forming a uniformly thick film. As a result, the build-up at the edges of the passivation layer 180 is remarkably reduced to improve the transmissive and the reflective characteristics of the passivation layer 180.

Subsequently, the gate insulating layer 140 is etched using the passivation layer 180 as an etch mask to complete the contact holes 181.

Finally, a plurality of pixel electrodes 190 and a plurality of contact assistants 81 and 82 are formed on the passivation layer 180 and on the exposed portions of the drain electrodes 175, the end portions 129 of the gate lines 121, and the end portions 179 of the data lines 171 by sputtering, lithography, and etching an IZO or ITO layer as shown FIGS. 1 and 2.

The above-described photosensitive resin composition may be employed to other insulating layers such as the gate insulating layer 140.

Embodiment 3

Figure 7:
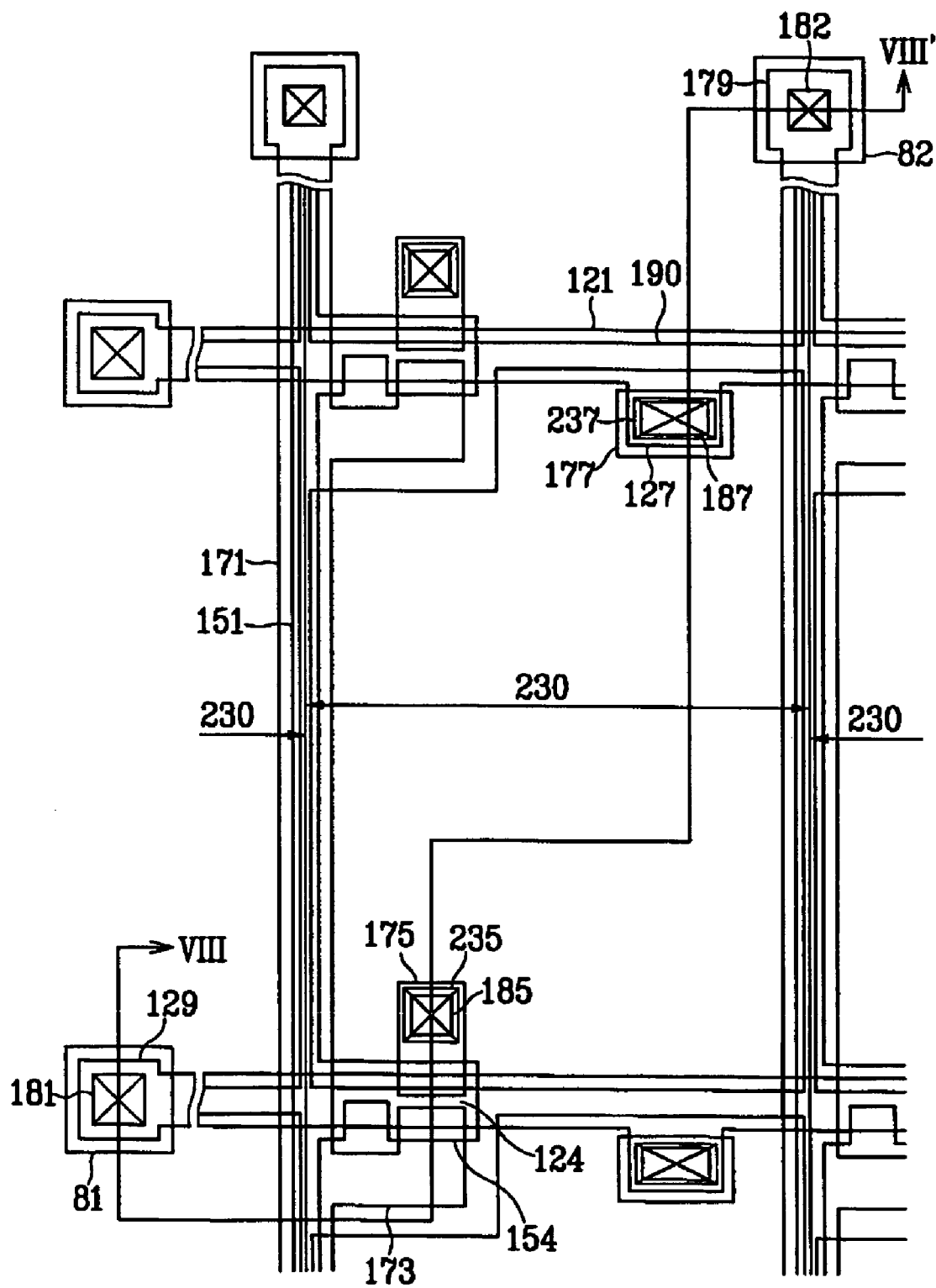
FIG. 7 is a layout view of a TFT array panel according to another embodiment of the present invention.
Figure 8:
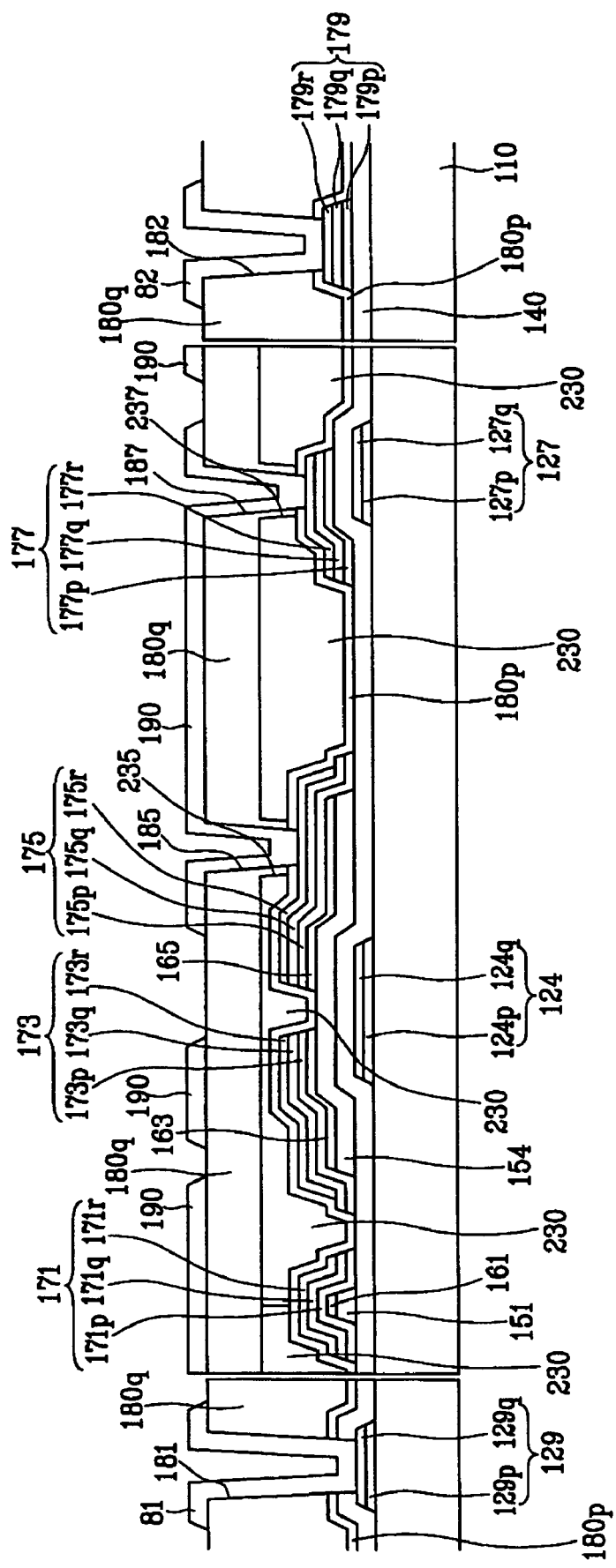
FIG. 8 is a sectional view of the TFT array panel shown in FIG. 7 taken along the line VIII-VIII'.

FIG. 7 is a layout view of a TFT array panel according to another embodiment of the present invention and FIG. 8 is a sectional view of the TFT array panel shown in FIG. 7 taken along the line VIII-VIII'.

A plurality of gate lines 121 are formed on an insulating substrate 110 such as transparent glass or plastic.

The gate lines 121 transmit gate signals and extend substantially in a first direction. Each gate line 121 includes a plurality of gate electrodes 124, a plurality of projections 127 projecting downward, and an end portion 129 having a large area for contact with another layer or an external driving circuit. A gate driving circuit (not shown) for generating the gate signals may be mounted on a flexible printed circuit (FPC) film (not shown), which may be attached to the substrate 110, directly mounted on the substrate 110, or integrated onto the substrate 110. The gate lines 121 may extend to be connected to a driving circuit that may be integrated on the substrate 110.

The gate lines 121 include two conductive films that have different physical characteristics: a lower film and an upper film disposed on the lower film. The lower film is preferably made of a low-resistivity metal, for example an Al-containing metal such as Al and Al alloy, Ag-containing metal such as Ag and Ag alloy, and Cu-containing metal such as Cu and Cu alloy, for reducing signal delay or voltage drop. The upper film is preferably made of a material such as Mo containing metal such as Mo and Mo alloy, Cr, Ta, or Ti, which has good physical, chemical, and electrical contact characteristics with other materials such as indium tin oxide (ITO) or indium zinc oxide (IZO). A good example of the combination of the two films is a lower Al (alloy) film and an upper Mo (alloy) film.

However, the lower film may be made of good contact material, and the upper film may be made of a low-resistivity material. In this case, the upper film 129q of the end portions 129 of the gate lines 121 may be removed to expose the lower film 129p. In addition, the gate lines 121 may include a single layer preferably made of the above-described materials. Otherwise, the gate lines 121 may be made of various metals or conductors.

In FIGS. 7 and 8, for the gate electrodes 124 and the projections 127, the lower and upper films are denoted by the additional characters p and q, respectively.

The lateral sides of the gate lines 121 are inclined relative to a surface of the substrate 110, and the inclination angle is in the range of about 30-80 degrees.

A gate insulating layer 140 preferably made of silicon nitride (SiNx) or silicon oxide (SiOx) is formed on the gate lines 121.

A plurality of semiconductor stripes 151 preferably made of hydrogenated amorphous silicon (abbreviated to "a-Si") or polysilicon are formed on the gate insulating layer 140. Each semiconductor stripe 151 extends substantially in the second direction and become wide near the gate lines 121 such that the semiconductor stripes 151 cover large areas of the gate lines 121. Each semiconductor stripe 151 has a plurality of projections 154 branching out toward the gate electrodes 124.

A plurality of ohmic contact stripes and islands 161 and 165 are formed on the semiconductor stripes 151. The ohmic contact stripes and islands 161 and 165 are preferably made of n+hydrogenated a-Si heavily doped with n-type impurity such as phosphorous or they may be made of silicide. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate 110, and the inclination angles are preferably in a range of about 30-80 degrees.

A plurality of data lines 171, a plurality of drain electrodes 175, and a plurality of storage conductors 177 are formed on the ohmic contacts 161 and 165 and the gate insulating layer 140.

The data lines 171 transmit data signals and extend substantially in the second direction to intersect the gate lines 121. The second direction is substantially perpendicular to the first direction. Each data line 171 includes a plurality of source electrodes 173 projecting toward the gate electrodes 124 and an end portion 179 having a large area for contact with another layer or an external driving circuit. A data driving circuit (not shown) for generating the data signals may be mounted on a FPC film (not shown), which may be attached to the substrate 110, directly mounted on the substrate 110, or integrated onto the substrate 110. The data lines 171 may extend to be connected to a driving circuit that may be integrated on the substrate 110.

The drain electrodes 175 are separated from the data lines 171 and disposed opposite the source electrodes 173 with respect to the gate electrodes 124.

A gate electrode 124, a source electrode 173, and a drain electrode 175 along with a projection 154 of a semiconductor stripe 151 form a TFT having a channel formed in the projection 154 disposed between the source electrode 173 and the drain electrode 175. The storage conductors 177 are disposed on the projections 127 of the gate lines 121.

The data lines 171, the drain electrodes 175, and the storage conductors 177 have a triple-layered structure including a lower film 171p and 175p, an intermediate film 171q and 175q, and an upper film 171r and 175r. The lower film 171p and 175p is preferably made of a refractory metal such as Cr, Mo, Ta, Ti, or alloys thereof, the intermediate film 171q and 175q is preferably made of a low-resistivity metal such as an Al-containing metal, a Ag-containing metal, and a Cu-containing metal, and the upper film 171r and 175r is made of refractory metal or alloys thereof having a good contact characteristic with ITO or IZO.

The data lines 171, the drain electrodes 175, and the storage conductors 177 may have a double-layered structure including a refractory-metal lower film (not shown) and a low-resistivity upper film (not shown) or a single-layer structure preferably made of the above-described materials. However, the data lines 171, the drain electrodes 175, and the storage conductors 177 may be made of various metals or conductors.

In FIGS. 7 and 8, for the source electrodes 173, the storage conductors 177, and the end portions 179 of the data lines 171, the lower, the intermediate, and the upper films thereof are denoted by additional characters p, q and r, respectively.

The data lines 171, the drain electrodes 175, and the storage conductors 177 have inclined edge profiles, and the inclination angles range about 30-80 degrees.

The ohmic contacts 161 and 165 are interposed only between the underlying semiconductor stripes 151 and the overlying conductors 171 and 175, and reduce the contact resistance therebetween. Although the semiconductor stripes 151 are narrower than the data lines 171 at most places, the width of the semiconductor stripes 151 becomes large near the gate lines 121 as described above, to smooth the profile of the surface, thereby preventing the disconnection of the data lines 171. The projections 154 of the semiconductor stripes 151 include some exposed portions, which are not covered with the data lines 171, the drain electrodes 175, and the storage conductors 177 such as portions located between the source electrodes 173 and the drain electrodes 175.

A lower passivation film 180p is formed on the data lines 171, the drain electrodes 175, the storage conductors 177, and the exposed portions of the semiconductor stripes 151. The lower passivation film 180p is preferably made of an inorganic insulator such as silicon nitride or silicon oxide.

A plurality of color filter stripes 230 are formed on the lower passivation film 180p.

The color filter stripes 230 extend along the second direction and each of the color filter stripes 230 represent one of the primary colors (red, green, and blue). Adjacent color filter stripes 230 represent different colors and they have edges exactly matching with each other on the data lines 171. However, the adjacent color filter stripes 230 may overlap each other to block the light leakage between the pixel electrodes 190, or may be spaced apart from each other. The color filter stripes 230 do not exist in the peripheral areas provided with the end portions 129 and 179 of the signal lines 121 and 171.

When the color filter stripes 230 are disposed on the substrate 110 along with the TFTs, the aperture ratio can be increased.

An upper passivation film 180q is formed on the color filter stripes 230. The lower and the upper passivation films 180p and 180q prevent pigments in the color filter stripes 230 from permeating into other layers.

The upper passivation film 180q is preferably made of photosensitive organic insulator having dielectric constant preferably less than about 4.0. The passivation 180 may have a flat surface.

The organic insulator for the upper passivation 180q is a photosensitive resin composition including an alkali-soluble resin, a quinone diazide, surfactants, and a solvent. The solvent includes a diethylene glycol dialkyl ether that includes an alkyl group including one to five carbon atoms, an ethyl 3-ethoxy propionate, an alkyl acetate that includes an alkyl group including three to eight carbon atoms, and an alkyl lactate that includes an alkyl group including one to six carbon atoms.

The solvent in the photosensitive resin composition has an improved solubility for solid ingredients such as the alkali-soluble resin and the quinone diazide to make the photosensitive resin composition uniformly spread. Among the solvent ingredients, diethylene glycol dialkyl ether, ethyl 3-ethoxy propionate, and butyl lactate properly adjust the drying speed by their high boiling points to prevent the dry of a front end of an injection nozzle and they improves the solubility for the solid ingredients. In addition, butyl acetate in the solvent improves the flatness of the resin composition. Accordingly, the photosensitive resin composition regulates the volatilization rate of the solvent to reduce stains caused by inferior dry of the solvent and improves the solubility for the solid ingredients, thereby forming a uniformly thick film. As a result, the build-up at edges of the upper passivation film 180q is remarkably reduced to improve the transmissive and the reflective characteristics of the upper passivation film 180q.

The passivation films 180p and 180q have a plurality of contact holes 182, 185 and 187 exposing the end portions 179 of the data lines 171, the drain electrodes 175, and the storage conductors 177, respectively. The passivation layer 180 and the gate insulating layer 140 have a plurality of contact holes 181 exposing the end portions 129 of the gate lines 121. Furthermore, the color filter stripes 230 have a plurality of contact holes 235 and 237 exposing lower portions of the contact holes 185 and 187 and surfaces of the lower passivation film 180q near the contact holes 185 and 187.

A plurality of pixel electrodes 190 and a plurality of contact assistants 81 and 82 are formed on the upper passivation film 180q. They are preferably made of a transparent conductor such as ITO or IZO or a reflective conductor such as Ag, Al, Cr, or alloys thereof.

The pixel electrodes 190 are electrically connected to the drain electrodes 175 through the contact holes 185 and connected to the storage conductors 177 through the contact holes 177 such that the pixel electrodes 190 receive data voltages from the drain electrodes 175 and transmit the data voltages to the storage conductors 177. The pixel electrodes 190 supplied with the data voltages generate electric fields in cooperation with a common electrode (not shown) of an opposing display panel (not shown) supplied with a common voltage, which determine the orientations of liquid crystal molecules (not shown) of a liquid crystal layer (not shown) disposed between the two electrodes. A pixel electrode 190 and the common electrode form a liquid crystal capacitor.

A pixel electrode 190 overlaps a projection 127 of a previous gate line 121. The pixel electrode 190 and a storage conductor 177 connected thereto and the projection 127 form a storage capacitor.

The pixel electrodes 190 overlap the gate lines 121 and the data lines 171 to increase the aperture ratio.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and enhance the adhesion between the end portions 129 and 179 and external devices.

Now, a method of manufacturing the TFT array panel shown in FIGS. 7 and 8 is described in detail with reference to FIGS. 9A-10B as well as FIGS. 7 and 8.

Figure 9A:
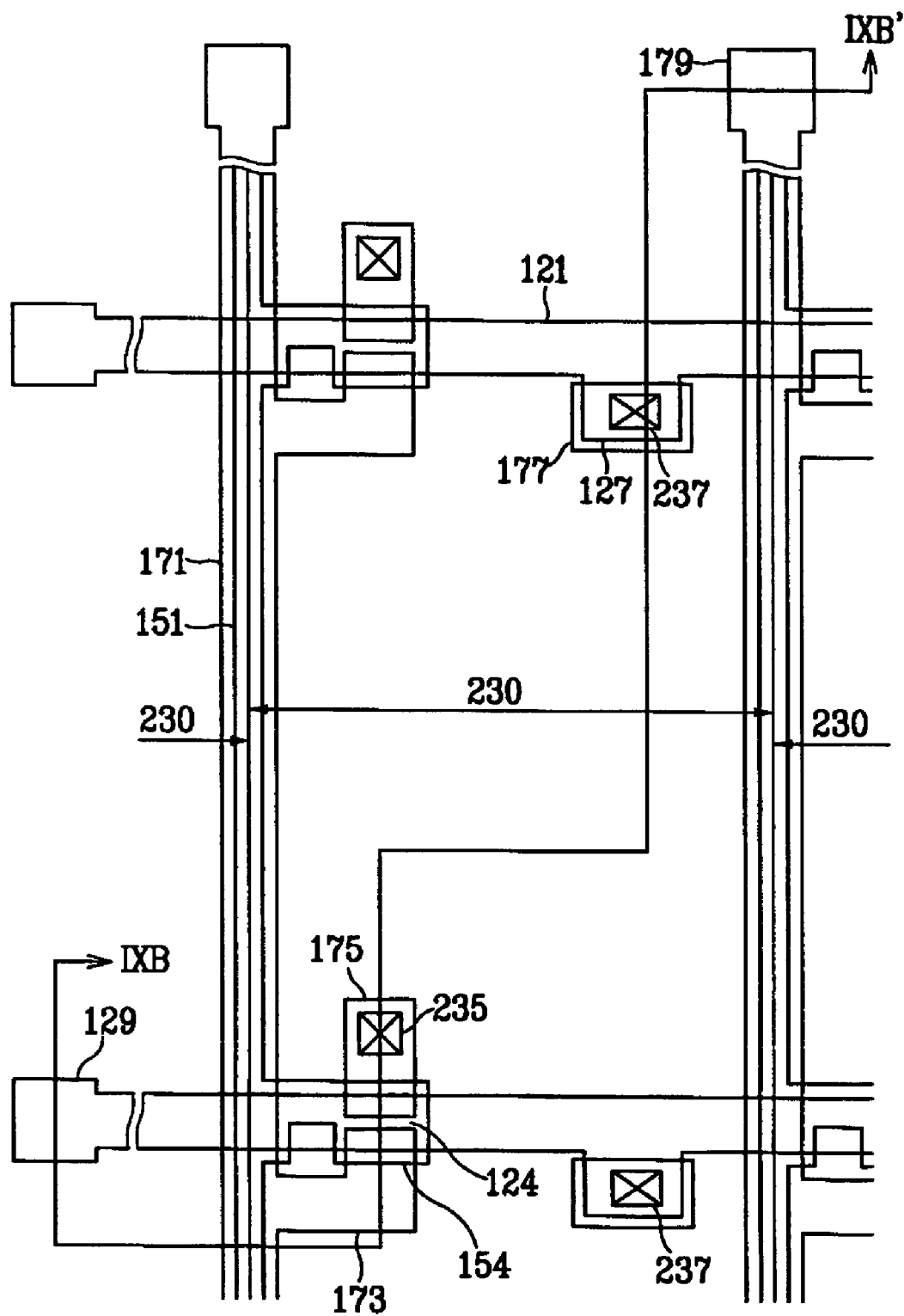
FIGS. 9A and 10A are layout views of the TFT array panel shown FIGS. 7 and 8 in intermediate steps of a manufacturing method thereof according to an embodiment of the present invention.
Figure 9B:
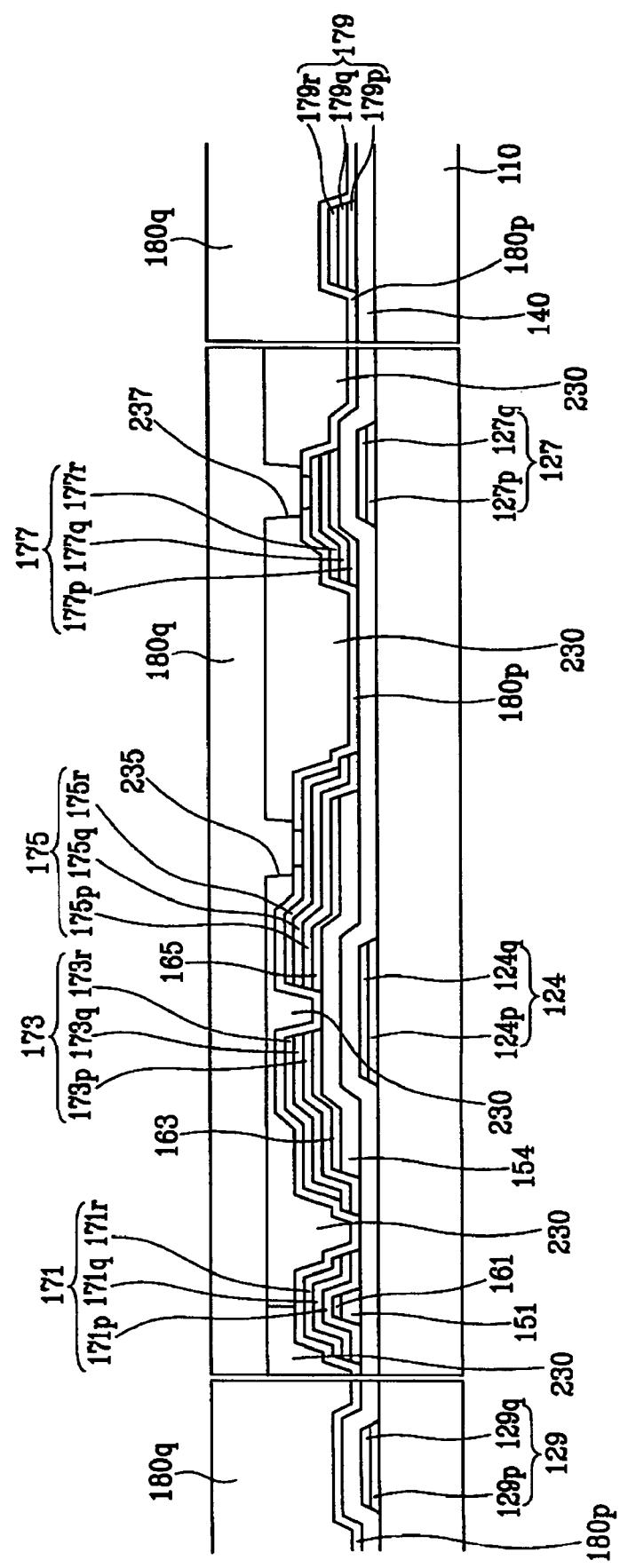
FIG. 9B is a sectional view of the TFT array panel shown in FIG. 9A taken along the line IXB-IXB'.
Figure 10A:
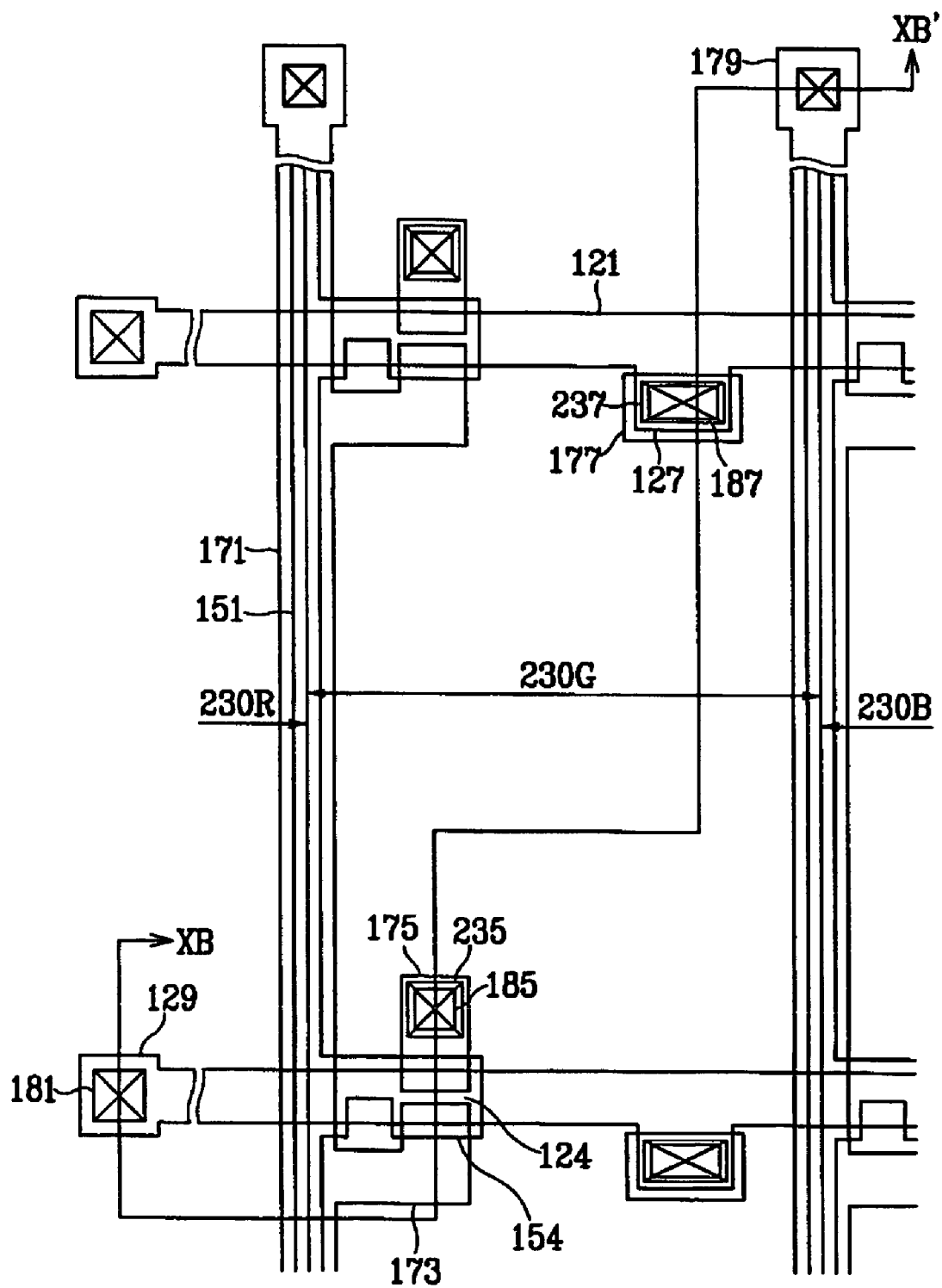
Figure 10B:
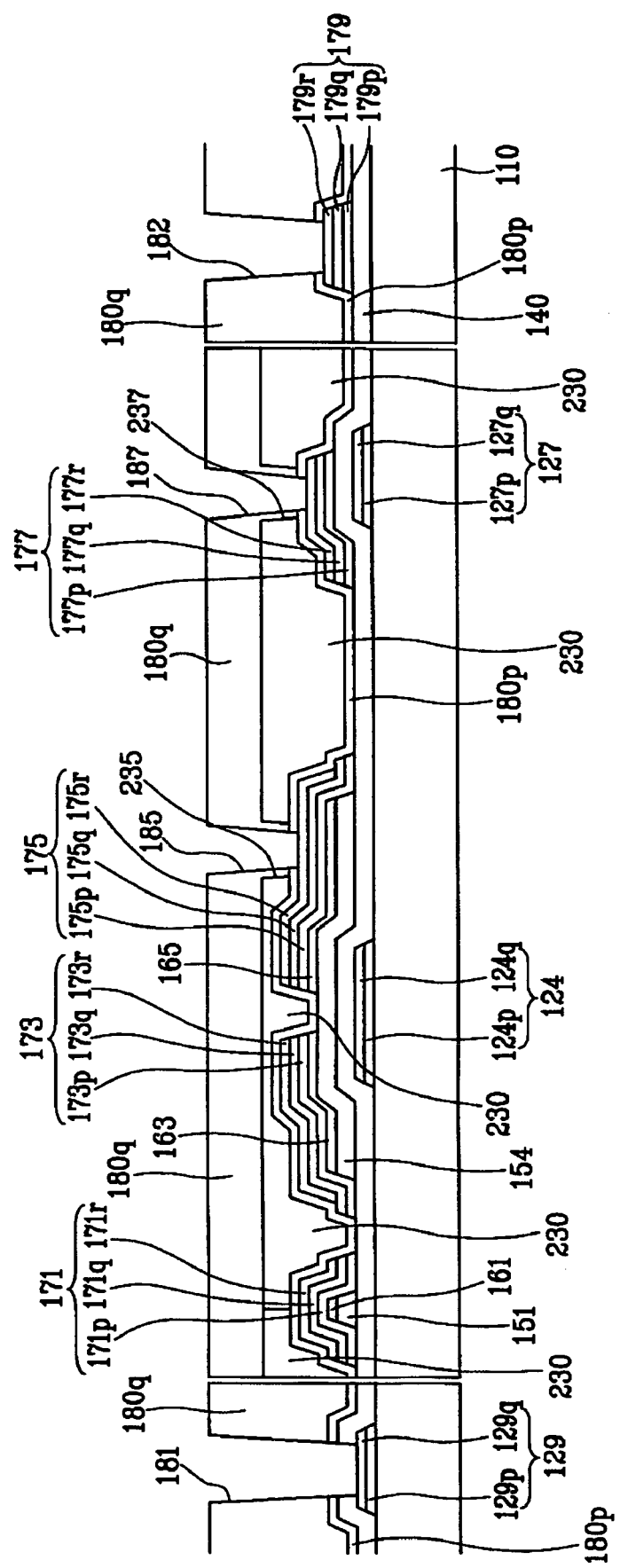
FIG. 10B is a sectional view of the TFT array panel shown in FIG. 9A taken along the line XB-XB'.
Figure 11A:
FIGS. 11A and 11F are photographs illustrating photosensitive resin films according to an example of the present invention and comparative examples.
Figure 11B:
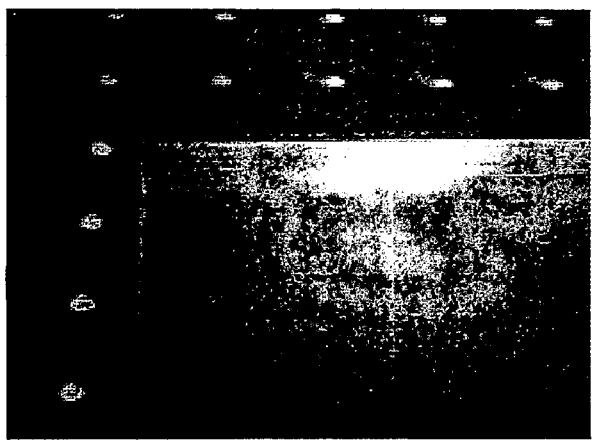
Figure 11C:
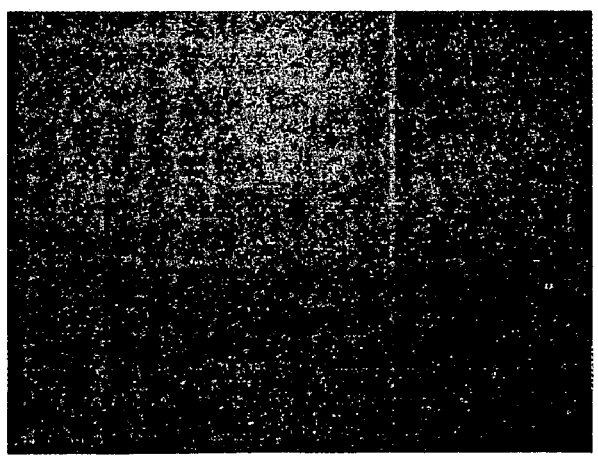
Figure 11D:
Figure 11E:
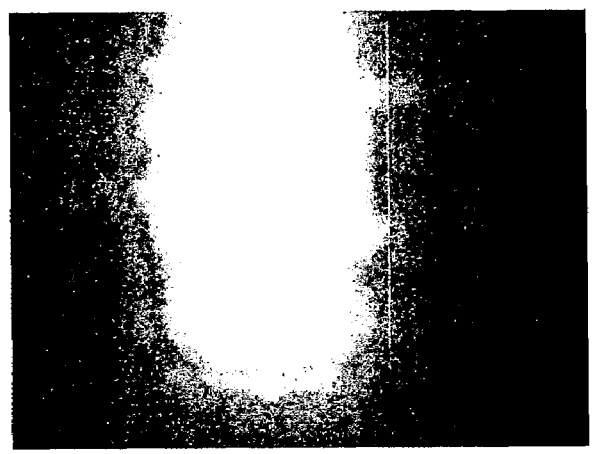
Figure 11F:
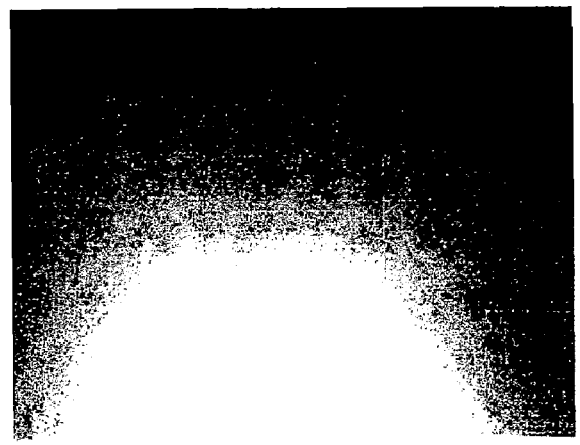

FIGS. 9A and 10A are layout views of the TFT array panel shown FIGS. 7 and 8 in intermediate steps of a manufacturing method thereof according to an embodiment of the present invention, FIG. 9B is a sectional view of the TFT array panel shown in FIG. 9A taken along the line IXB-IXB', and FIG. 10B is a sectional view of the TFT array panel shown in FIG. 9A taken along the line XB-XB'.

Referring to FIGS. 9A and 9B, a plurality of gate lines 121 including gate electrodes projections 127 and end portions 129 are formed on an insulating substrate 110. A gate insulating layer 140, a plurality of semiconductor stripes 151 including projections 154, and a plurality of ohmic contacts 161 and 165 including projections 163 are sequentially formed on the gate lines 121 and the substrate 110. A plurality of data lines 171 including source electrodes 173, a plurality of data lines 171, and a plurality of storage conductors 177 are formed on the ohmic contacts 161 and 163 and the gate insulating layer 140. A lower passivation film 180p is formed by PECVD, etc. A negative photosensitive film including one of primary color pigments is coated and patterned to form a plurality of color filter stripes having contact holes 235 and 237. Repeating the film coating and patterning for other primary colors, a plurality of color filter stripes 230 representing other primary colors are also formed.

Next, a photosensitive resin film including an alkali-soluble resin, a quinone diazide, surfactants, and a solvent is coated on the color filter stripes 230. The solvent includes a diethylene glycol dialkyl ether that includes an alkyl group including one to five carbon atoms, an ethyl 3-ethoxy propionate, an alkyl acetate that includes an alkyl group including three to eight carbon atoms, and an alkyl lactate that includes an alkyl group including one to six carbon atoms.

The coating is performed by slit coating while moving the substrate 110 or a nozzle (not shown) of a coater (not shown). The thickness of the coated resin composition is from about 1.0 to about 8.0 microns.

After the coating, the substrate 110 coated with the photosensitive resin composition is put into an oven and prebaked for from about 90 to about 180 seconds at a temperature of about 90 to about 110° C. The prebaking removes volatile ingredients such as solvents.

Next, the photosensitive film is aligned with a mask by using a mask aligner and subjected to a first exposure through the mask. The light exposure generates light, such as a g line or a g line vertically over an entire surface of the photosensitive resin film.

The photoresist resin film is then developed by puddle development with a developer of an alkaline aqueous solution preferably containing 3 wt. % diisopropyl amine. The developer dissolves exposed portions of the photosensitive resin film, which are exposed to light, and leaves unexposed portions of the photosensitive resin film to form an upper passivation film 180q having upper portions of a plurality of contact holes 181, 182, 185 and 187 as shown in FIGS. 10A and 10B.

Since the photosensitive resin composition includes the quinone diazide, the exposed portions of the photosensitive resin film is quickly removed in a short time, while the unexposed portions thereof is hardly removed even though they are in contact with the developer for a long time.

After the development, the substrate 110 with the upper passivation film 180q is cleaned with deionized water and dried.

A portion or an entire portion of the upper passivation film 180q is then subjected to a second light exposure preferably using (deep) ultraviolet (UV) ray. The illumination of UV on unit area in the second light exposure may be higher than that in the first light exposure. The second light exposure removes the portions that may have been insufficiently exposed to light in the first light exposure to reduce the remnants.

The upper passivation film 180q is postbaked for about 5 to about 120 minutes and more preferably for about 15 to about 90 minutes at a temperature of about 150° C. to about 250° C. and more preferably about 180° C. to about 240° C. The postbaking is performed by heating the substrate 110 with a hot plate (not shown). The postbaking improves the heat resistance and the solvent resistance of the cured photosensitive resin pattern.

The solvent in the photosensitive resin composition has an improved solubility for solid ingredients such as the alkali-soluble resin and the quinone diazide to make the photosensitive resin composition uniformly spread. Among the solvent ingredients, diethylene glycol dialkyl ether, ethyl 3-ethoxy propionate, and butyl lactate properly adjust the drying speed by their high boiling points to prevent the dry of a front end of an injection nozzle and they improves the solubility for the solid ingredients. In addition, butyl acetate in the solvent improves the flatness of the resin composition. Accordingly, the photosensitive resin composition regulates the volatilization rate of the solvent to reduce stains caused by inferior dry of the solvent and improves the solubility for the solid ingredients, thereby forming a uniformly thick film. As a result, the build-up at the edges of the upper passivation film 180q is remarkably reduced to improve the transmissive and the reflective characteristics of the upper passivation film 180q.

Subsequently, the lower passivation film 180p and the gate insulating layer 140 are etched using the upper passivation film 180q as an etch mask to complete the contact holes 181, 182, 185 and 187.

Finally, a plurality of pixel electrodes 190 and a plurality of contact assistants 81 and 82 are formed on the upper passivation film 180q and on the exposed portions of the drain electrodes 175, the end portions 129 of the gate lines 121, and the end portions 179 of the data lines 171 by sputtering, lithography, and etching an IZO or ITO layer as shown FIGS. 7 and 8.

The above-described photosensitive resin composition may be employed to other insulating layers such as the gate insulating layer 140 and the lower passivation film 180p.

Many of the above-described features of the TFT array panel and the manufacturing method thereof shown in FIGS. 1-6B may be appropriate for the TFT array panel and the manufacturing method thereof shown in FIGS. 7A-10B.

The above-described photosensitive resin composition may be also employed to insulating layers or slope members on the other panel that is combined with a TFT panel. In addition, the above-described photosensitive resin composition may be employed in other display devices such as organic light emitting diode (OLED) display.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A photosensitive resin composition comprising:
   an alkali-soluble resin;
   a quinone diazide;
   a surfactant; and
   a solvent that includes
      a diethylene glycol dialkyl ether that includes an alkyl group having one to five carbon atoms,
      an ethyl 3-ethoxy propionate,
      an alkyl acetate that includes an alkyl group having three to eight carbon atoms, and
      an alkyl lactate that includes an alkyl group having one to six carbon atoms.

2. The composition of claim 1, wherein the weight percentage of the diethylene glycol dialkyl ether in the solvent is about 10 to about 70 wt. %, the weight percentage of the ethyl 3-ethoxy propionate in the solvent is about 10 to about 70 wt. %, the weight percentage of the alkyl acetate in the solvent is about 1 to about 20 wt. %, and the weight percentage of the alkyl lactate in the solvent is from about 1 to about 20 wt. %.

3. The composition of claim 1, wherein the diethylene glycol dialkyl comprises a diethylene glycol methyl ethyl ether and the alkyl acetate comprises butyl acetate, and the alkyl lactate comprises butyl lactate.

4. The composition of claim 1, wherein the weight percentage of the solvent in the photosensitive resin composition ranges from about 50 to about 95 wt. %.

5. The composition of claim 1, wherein the weight percentage of the alkali-soluble resin in a total solid content of the photosensitive resin composition ranges from about 50 to about 98 wt. %.

6. The composition of claim 1, wherein the weight percentage of the quinone diazide in a total solid content of the photosensitive resin composition ranges from about 2 to about 50 wt. %.

7. The composition of claim 1, wherein the weight percentage of the surfactant in a total solid content of the photosensitive resin composition is at most about 0.3 wt. %.

8. The composition of claim 1, further comprising at least one of a cationic polymerization initiator, a phenolic compound, a cross-linking agent, a polymerizable monomer, and a silane coupling agent.

9. The composition of claim 1, wherein the surfactant comprises:
   an organic fluorine compound of

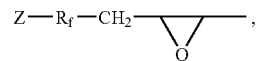

where $R_f$ is a chained or branched perfluoroalkylene group including about 5-10 carbon atoms and Z is a hydrogen or a fluorine;

a first silicone compound of

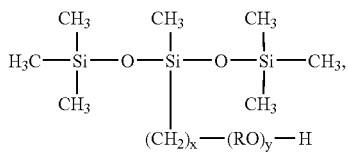

where R is a chained or branched alkylene group including about 2-5 carbon atoms and each of x and y is an integer of about 1-20; and a second silicone compound of

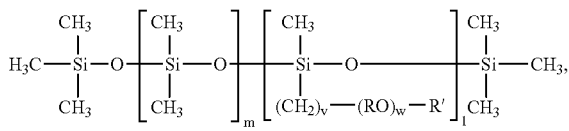

where R' is an alkyl group including about 1-20 carbon atoms or a chained or branched carbonyl alkyl group including about 2-21 carbon atoms and each of v and w is an integer of about 1-20, and each of m and l is an integer of about 1-9 wherein (m+l) lies between 2 and 10.

10. A thin film panel comprising:
a substrate;
a thin film pattern formed on the substrate; and
an insulating layer formed on the thin film pattern and made from a photosensitive resin composition including an alkali-soluble resin, a quinone diazide, a surfactant, and a solvent that comprises:
a diethylene glycol dialkyl ether that includes an alkyl group having one to five carbon atoms,
an ethyl 3-ethoxy propionate,
an alkyl acetate that includes an alkyl group having three to eight carbon atoms, and
an alkyl lactate that includes an alkyl group having one to six carbon atoms.

11. The thin film panel of claim 10, wherein the weight percentage of the diethylene glycol dialkyl ether in the solvent is from about 10 to about 70 wt. %, the weight percentage of the ethyl 3-ethoxy propionate in the solvent is from about 10 to about 70 wt. %, the weight percentage of the alkyl acetate in the solvent is from about 1 to about 20 wt. %, and the weight percentage of the alkyl lactate in the solvent is from about 1 to about 20 wt. %.

12. The thin film panel of claim 10, wherein the thin film pattern comprises conductive signal lines.

13. The thin film panel of claim 10, wherein the thin film pattern comprises:
a gate line;
a gate insulator formed on the gate line
a semiconductor layer formed on the gate insulator; and
a data line and a drain electrode formed on the semiconductor layer.

14. The thin film panel of claim 13, further comprising a pixel electrode formed on the insulating layer and connected to the drain electrode.

15. The thin film panel of claim 13, further comprising a color filter disposed under the insulating layer.

16. A method of manufacturing a thin film panel, the method comprising:
forming a thin film pattern on a substrate;
coating a photosensitive resin composition including an alkali-soluble resin, a quinone diazide, a surfactant, and a solvent;
performing a light exposure on the photosensitive resin composition through a photomask; and
developing the photosensitive resin composition to obtain a thin film pattern,
wherein the solvent comprises:
a diethylene glycol dialkyl ether that includes an alkyl group having one to five carbon atoms,
an ethyl 3-ethoxy propionate,
an alkyl acetate that includes an alkyl group having three to eight carbon atoms, and
an alkyl lactate that includes an alkyl group having one to six carbon atoms.

17. The method of claim 16, wherein the coating of the photosensitive resin composition uses a slit-type nozzle.

18. The method of claim 16, wherein the photosensitive resin composition has a thickness of about 1.0 to about 8.0 microns.

19. The method of claim 16, further comprising:
removing the solvent from the photosensitive resin composition before the light exposure.

20. The method of claim 16, further comprising:
exposing the thin film pattern to light after the development; and
baking the thin film pattern after the exposure.

21. The method of claim 16, further comprising:
baking the thin film pattern after the development.

22. The method of claim 16, wherein the formation of the thin film pattern comprises:
forming signal lines on the substrate.

23. The method of claim 16, wherein the formation of the thin film pattern comprises:
forming a gate line on the substrate;
depositing a gate insulating layer and a semiconductor layer in sequence;
etching the semiconductor layer; and
forming a data line and a drain electrode on the semiconductor layer.

24. The method of claim 23, further comprising:
forming a pixel electrode on the photosensitive resin composition,
wherein the photosensitive resin composition has a contact hole exposing the drain electrode and the pixel electrode is connected to the drain electrode.

* * * * *

UNITED STATES PATENT AND TRADEMARK OFFICE
CERTIFICATE OF CORRECTION

PATENT NO. : 7,338,737 B2  Page 1 of 1
APPLICATION NO. : 11/302727
DATED : March 4, 2008
INVENTOR(S) : Hi-Kuk Lee et al.

It is certified that error appears in the above-identified patent and that said Letters Patent is hereby corrected as shown below:

Title Page, Item (73) Assignee should be:
                    SAMSUNG ELECTRONICS CO., LTD.
                    SUMITOMO CHEMICAL CO., LTD.

Signed and Sealed this

Eighth Day of September, 2009

David J. Kappos
*Director of the United States Patent and Trademark Office*